(12) United States Patent
Longo Pazos et al.

(10) Patent No.: US 11,557,487 B2
(45) Date of Patent: Jan. 17, 2023

(54) ETCHING METAL DURING PROCESSING OF A SEMICONDUCTOR STRUCTURE

(71) Applicant: Tokyo Electron Limited, Minato-ku (JP)

(72) Inventors: Roberto C. Longo Pazos, Austin, TX (US); Peter Lowell George Ventzek, Austin, TX (US); Alok Ranjan, Austin, TX (US)

(73) Assignee: Tokyo Electron Limited, Minato-ku (JP)

( * ) Notice: Subject to any disclaimer, the term of this patent is extended or adjusted under 35 U.S.C. 154(b) by 0 days.

(21) Appl. No.: 17/339,436

(22) Filed: Jun. 4, 2021

(65) Prior Publication Data

US 2022/0392773 A1 Dec. 8, 2022

(51) Int. Cl.
*H01L 21/321* (2006.01)
*H01L 21/3213* (2006.01)

(52) U.S. Cl.
CPC .......... *H01L 21/32136* (2013.01); *H01L 21/32139* (2013.01)

(58) Field of Classification Search
None
See application file for complete search history.

(56) References Cited

U.S. PATENT DOCUMENTS

| 2003/0098292 A1* | 5/2003 | Kulkarni | ........... | H01L 21/32136 |
| | | | | 257/E21.311 |
| 2014/0110373 A1* | 4/2014 | Nishimura | ........ | H01L 21/31122 |
| | | | | 216/41 |
| 2021/0082714 A1 | 3/2021 | Xie et al. | | |

OTHER PUBLICATIONS

Datta et al., "Impact of Contact and Local Interconnect Scaling on Logic Performance," 2014 Symposium on VLSI Technology Digest of Technical Papers, 2 pages.
Jones, Wayne, "Electrolytic Copper Plating Additives and Contaminants," Universal Instruments, 28 pages.
Ohmi et al., "Significant Improvement of Copper Dry Etching Property of a High-Pressure Hydrogen-Based Plasma by Nitrogen Gas Addition," ACS Omega 2019, 4, 4360-4366, http://pubs.acs.org/journal/acsodf, 7 pages.
"Copper Interconnect Architecture," pctechguide.com, printed Mar. 16, 2021, 5 pages.
Tokei, Z et al.,"Inflection points in interconnect research and trends for 2nm and beyond in order to solve the RC bottleneck," 2020 IEEE International Electron Devices Meeting (IEDM), 2020, pp. 32.2.1-32.2.4, doi: 10.1109/IEDM13553.2020.9371903. 4 pages total.

(Continued)

*Primary Examiner* — Roberts P Culbert
(74) *Attorney, Agent, or Firm* — Slater Matsil, LLP

(57) ABSTRACT

In certain embodiments, a method of processing a semiconductor structure includes forming a patterned layer over a copper layer to be etched. The copper layer is disposed over a substrate. The method includes patterning the copper layer, using the patterned layer as an etch mask, by performing a cyclic etch process to form a recess in the copper layer. The cyclic etch process includes forming, in a first etch step, a passivation layer on an exposed surface of the copper layer by exposing the exposed surface of the copper layer to a chlorine gas. The passivation layer replaces at least a portion of a surface layer of the copper layer. The cyclic etch process includes subsequently etching, in a second etch step, the passivation layer using a first plasma that includes a noble gas. Each cycle of the cyclic etch process extends the recess in the copper layer.

20 Claims, 14 Drawing Sheets

(56) References Cited

OTHER PUBLICATIONS

"Copper Interconnect Architecture," pctechguide.com, accessed at https://web.archive.org/web/20110721000305/http://www.pctechguide.com:80/cpu-architecture/copper-inteconnect-architecture, Jul. 21, 2011, 3 pages.

* cited by examiner

ETCHING METAL DURING PROCESSING OF A SEMICONDUCTOR STRUCTURE

TECHNICAL FIELD

This disclosure relates generally to semiconductor fabrication, and, in particular embodiments, to etching metal during processing of a semiconductor structure.

BACKGROUND

Generally, semiconductor devices, such as integrated circuits (ICs), are fabricated by sequentially depositing and patterning layers of dielectric, conductive, and semiconductor materials over a semiconductor substrate, using photolithography and etching to form structures that operate as circuit components (e.g., transistors, resistors, and capacitors) and as interconnect elements (e.g., conductive lines, contacts, and vias). Examples of metals used to form conductive features in a semiconductor device, such as conductive features in a metallization layers, include copper, aluminum, and others.

The semiconductor industry has repeatedly reduced the minimum feature sizes in semiconductor devices to a few nanometers to increase the packing density of components. This miniaturization to a few nanometers has intensified various challenges associated with semiconductor fabrication. Fabrication processes, including plasma and other processes, are expected to deliver precise dimensions (e.g., linewidths, etch depth, and film thicknesses) in the nanometer range along with precisely controlled features, for example, conformality, anisotropy, selectivity, surface and line edge roughness, and edge profile, often at atomic scale dimensions, uniformly across a wide (e.g., 300 mm) wafer.

SUMMARY

In certain embodiments, a method of processing a semiconductor structure includes forming a patterned layer over a copper layer to be etched. The copper layer is disposed over a substrate. The method includes patterning the copper layer, using the patterned layer as an etch mask, by performing a cyclic etch process to form a recess in the copper layer. The cyclic etch process includes forming, in a first etch step, a passivation layer on an exposed surface of the copper layer by exposing the exposed surface of the copper layer to a chlorine gas. The passivation layer replaces at least a portion of a surface layer of the copper layer. The cyclic etch process includes subsequently etching, in a second etch step, the passivation layer using a first plasma that includes a noble gas. Each cycle of the cyclic etch process extends the recess in the copper layer.

In certain embodiments, a method of processing a semiconductor structure includes receiving a substrate, a copper-containing layer being formed on the substrate. The method includes performing a cyclic etch process to incrementally etch a portion of the copper-containing layer. The copper-containing layer has a target exposed surface defining the portion of the copper-containing layer to be etched. The cyclic etch process includes exposing, in a chlorine exposure step, the substrate with the copper-containing layer to a chlorine gas ($Cl_2$) to convert a portion of the copper-containing layer into copper chloride (CuCl) structures. The cyclic etch process includes subsequently exposing, in a plasma etch step, the substrate with the copper-containing layer to a first plasma. The first plasma includes a noble gas and is directed to the target exposed surface of the copper-containing layer with sufficient energy to cause at least a portion of the CuCl structures to be removed from the copper-containing layer.

In certain embodiments, a method of processing a semiconductor structure includes forming a patterned layer over a copper layer to be etched. The copper layer is disposed over a substrate. The method includes patterning the copper layer, using the patterned layer as an etch mask, by performing a cyclic etch process to incrementally form a recess in the copper layer. The cyclic etch process includes exposing, in a chlorine exposure step, the substrate with the copper layer to a chlorine gas ($Cl_2$), causing CuCl structures to form at one or more exposed surfaces of the copper layer. The cyclic etch process includes subsequently exposing, in a plasma etch step, the substrate with the copper layer to an argon-containing plasma that is directed to a target exposed surface of the copper layer with sufficient energy to cause at least a portion of the CuCl structures at the one or more exposed surfaces of the copper layer to be removed from the copper layer to extend the recess into the copper layer. At an initial instance of the chlorine exposure step, the one or more exposed surfaces of the copper layer include the target exposed surface, the target exposed surface being a top surface of the copper layer at a bottom of the recess. At subsequent instances of the chlorine exposure step, the one or more exposed surfaces of the copper layer include the target exposed surface and sidewall surfaces of the copper layer in the recess.

BRIEF DESCRIPTION OF THE DRAWINGS

For a more complete understanding of the present disclosure, and advantages thereof, reference is now made to the following descriptions taken in conjunction with the accompanying drawings, in which.

DETAILED DESCRIPTION OF ILLUSTRATIVE EMBODIMENTS

Figure 1A:
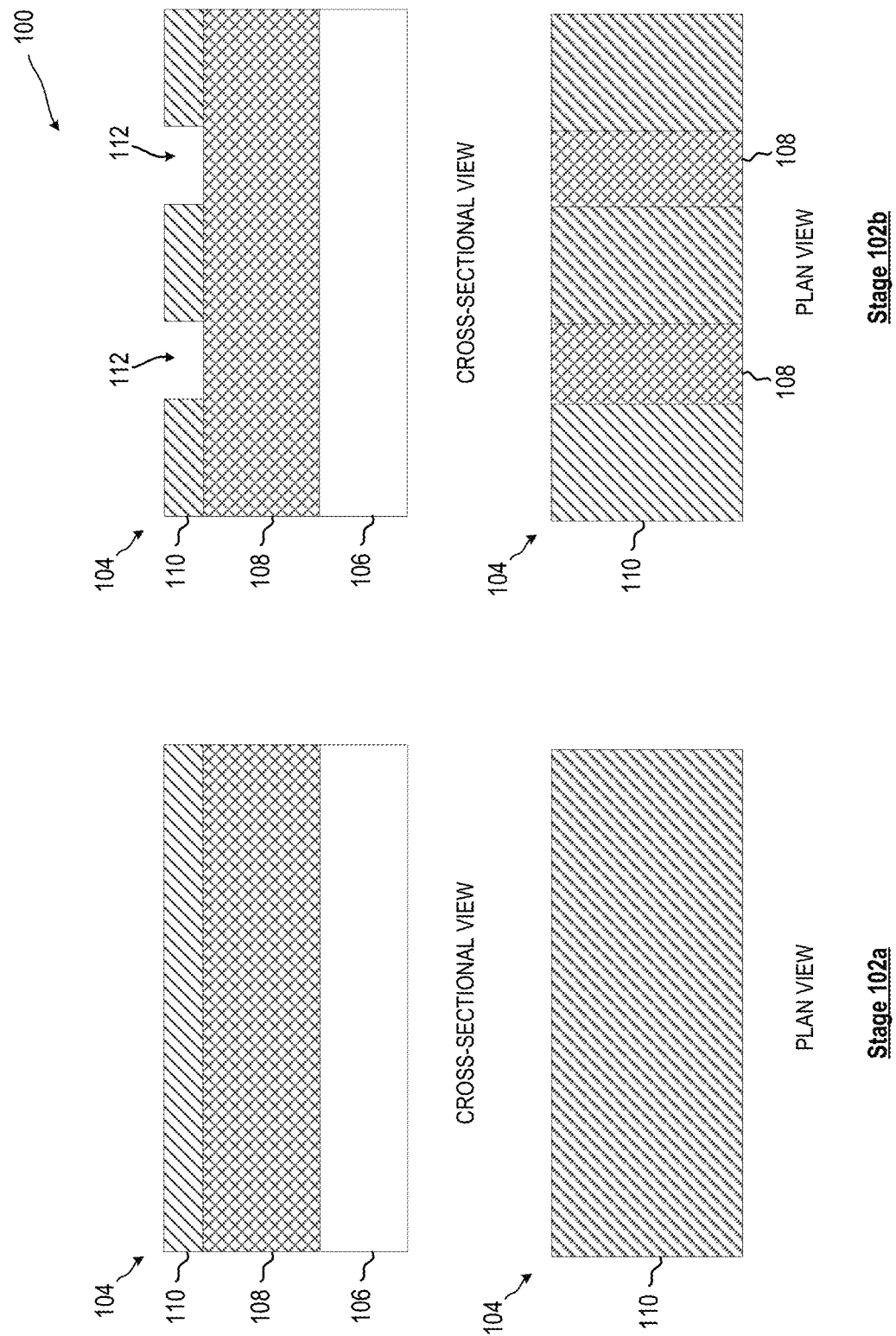
FIGS. 1A-1C illustrate cross-sectional and plan views of a semiconductor structure during a process for processing semiconductor structure, according to certain embodiments of this disclosure.

For years, and even still today, chip makers have used aluminum to form conductive features, such as conductive lines, conductive contacts, and conductive vias, in semiconductor devices. As device size continued to shrink, it became clear that using aluminum for certain conductive features presents challenges. For example, the resistivity of metals increases as the critical dimensions of lines and vias decrease, which may increase the resistance-capacitance (RC) delay of interconnects. Copper generally exhibits a lower resistivity than aluminum. In addition, copper may be more durable than aluminum, exhibiting a higher resistance to electromigration than aluminum. This greater resistance to electromigration may allow higher currents to flow through a particular size of copper conductor relative to an aluminum conductor of the same particular size. At smaller feature sizes, the ability of a copper conductor to carry higher currents may be advantageous. The Joule heating associated with electromigration may further exacerbate electromigration; hence, a lower resistivity metal may be advantageous.

Other metals, such as gold and silver, may provide similar advantages to copper, but are more costly than copper. Given these advantages, copper became, and generally remains, a preferred choice for forming conductive features in a semiconductor device, particularly in the interconnect layers.

However, using copper in a semiconductor device, whether for interconnects or otherwise, also presents challenges. For example, copper can be difficult to etch using techniques that might be suitable for semiconductor fabrication and in a high volume manufacturing environment.

Traditionally, copper structures within semiconductor devices have been formed using an additive rather than a subtractive process. For example, copper conductive features may be formed using a damascene or dual damascene process. Damascene processes are additive processes that include etching openings in a layer (e.g., a dielectric layer) in which a copper conductive feature is to be formed and then filling those openings with copper, often with one or more barrier layers deposited and one or more intervening and/or subsequent etches (e.g., a chemical mechanical polish) being performed. Damascene processes present challenges at smaller device sizes (including, potentially, an inability to achieve certain small pitch sizes and suffering poor gap filling of damascene recesses), and the numerous processes involved in a damascene process may damage other materials, such as the dielectric material (e.g., a low-k material). Furthermore, the damascene process involves complex etch integrations and also includes forming etch stop barrier (capping) layers that consume valuable dimension budget, which becomes even more problematic at smaller node sizes.

Attempts to form copper conductive features using a subtractive process to etch copper have presented other challenges.

For example, one subtractive approach for etching copper includes exposing a copper layer to a chlorine plasma, which forms copper chloride salts on the surface of the copper layer to be etched. These salts are might not be volatile and tend to grow. A wet removal is performed to remove the generated salt layer. This wet removal of the salt layer involves exposing the semiconductor substrate to chemicals that lack selectivity, meaning that those chemicals undesirably and unintentionally etch materials other than copper, and can cause surface damage to resulting copper structures and other surfaces. Additionally, the salt growth is isotropic and when mediated by plasma and chlorine radicals, the growth is not self-limiting. Furthermore, such processes are not viable for high volume manufacturing.

As another example of a subtractive approach for etching copper, a continuous plasma etch of copper also is problematic, with resultant morphology being a key issue. Plasma processes in which ions are used to continuously remove the copper chloride that forms during exposure of copper to a chlorine plasma (e.g., to remove the copper chloride at a rate faster than the copper chloride can accumulate) have poor morphology due to the effective chlorine coverage being low. Under this circumstance, etch by-products might not be volatile and may need substantial ion energy. Removing the copper chloride may produce a mix of sputtering and some chemical component. For example, etching copper using a continuous reactive ion etching (RIE) process may use high temperatures to cause the copper even to react to the plasma. Those high temperatures, however, may be destructive to semiconductor features. For example, a continuous plasma process and its associated high temperatures may negatively impact an IC device being formed (e.g., through dopant diffusion or other undesired effects), degrade an etch mask (e.g., a patterned photoresist layer) overlying the copper layer (e.g., impacting the profile of etched features), and/or cause stress migration at lower layers. Additionally, some dry etching processes use chlorine, which may contaminate or otherwise damage the copper. Furthermore, in a continuous process, the copper may redeposit, which may exacerbate surface roughness and etch-front profile problems.

For these and possibly other reasons, the combination of copper and chlorine has been viewed largely as impractical.

Due at least in part to the lack of a viable subtractive etch process for etching copper and forming copper conductive features, the additive damascene process remains the primary approach to forming copper conductive features, even with the numerous associated problems of the damascene process. Thus, the semiconductor fabrication industry has shown renewed interest in subtractive copper etch processes, as the conventional dual damascene approach has or may soon reach a limit for usefulness with smaller feature sizes.

In certain embodiments of this disclosure, a cyclic etch process provides a subtractive process to incrementally etch a copper layer. For example, the cyclic etch process may be used to etch one or more recesses in a copper or other metal layer. As described in greater detail below, rather than a single plasma or other etch step, the cyclic etch process of embodiments of this disclosure may include repeatedly performing two primary steps to incrementally form features in a copper (or other metal) layer: a passivation layer formation step (e.g., a chlorine exposure step) to form a passivation layer at exposed surfaces of the copper layer by exposing the exposed surfaces to chlorine gas, in a plasma or a thermal process for example; and an etch step that etches the passivation layer to remove portions of the copper layer (e.g., to form recess in the copper layer and ultimately form features, such as conductive features, of the copper layer). In certain embodiments, the cyclic etch process for etching copper can be used in a high volume manufacturing setting.

Figure 1B:
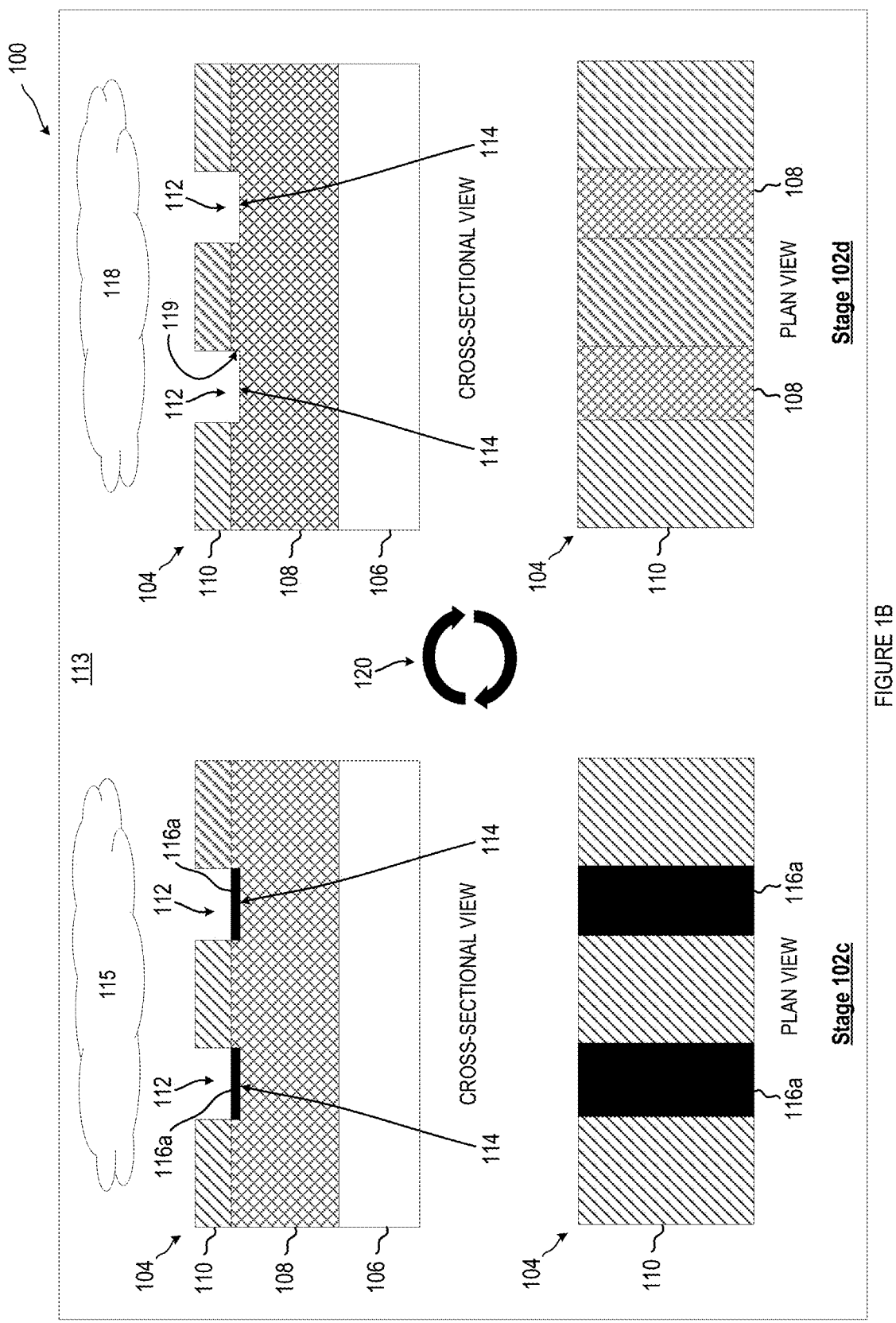
Figure 1C:
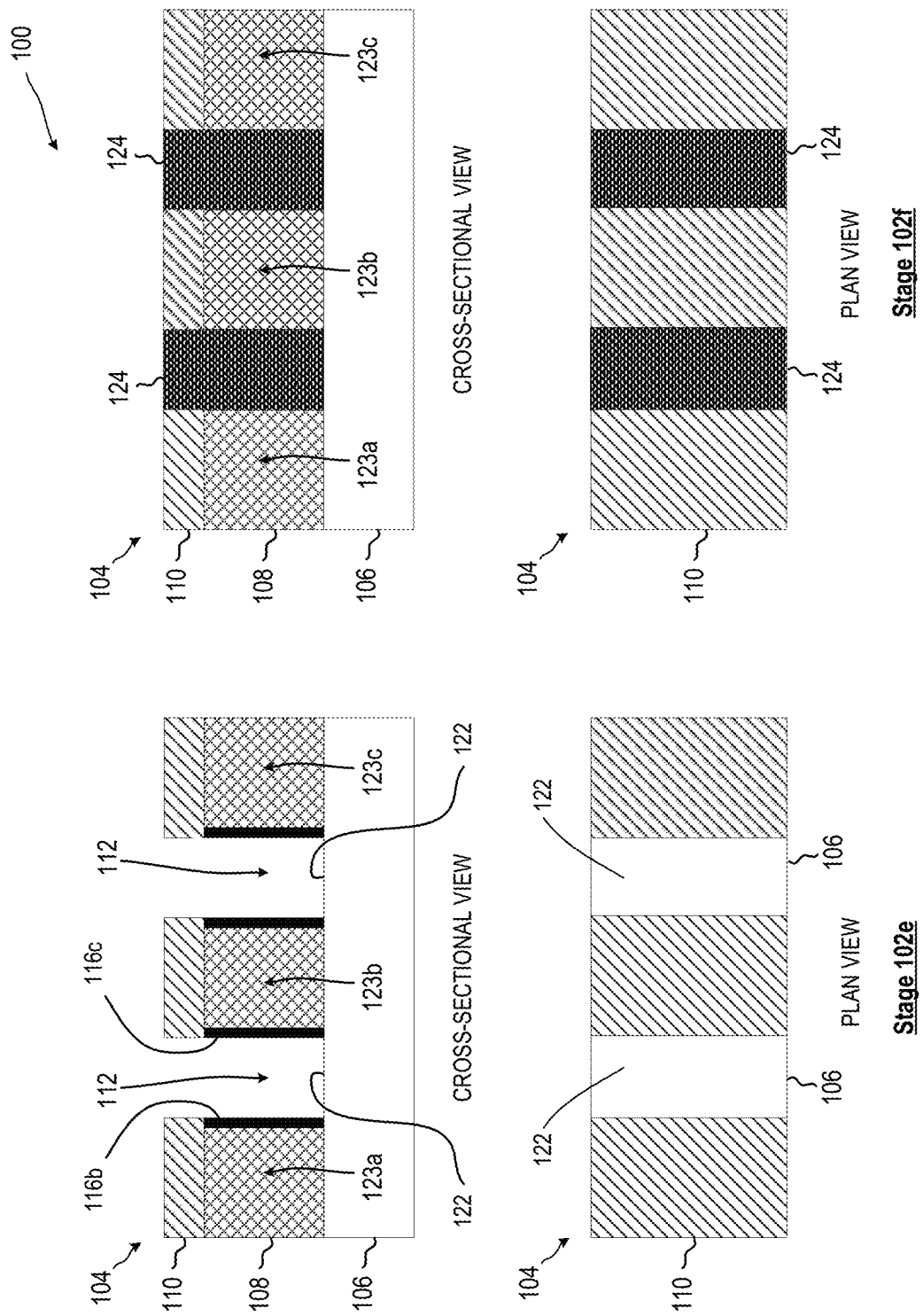

FIGS. 1A-1C illustrate cross-sectional and plan views of a semiconductor structure 104 during a process 100 for processing semiconductor structure 104, according to certain embodiments of this disclosure. In the illustrated example, process 100 includes stages 102a-102f of processing semiconductor structure 104. Semiconductor structure 104 is just one example of a structure that may be processed according to the disclosed techniques, and this disclosure contemplates processing any suitable semiconductor device. Throughout this disclosure, a "semiconductor structure" also may be referred to as a semiconductor device, substrate, or semiconductor wafer (or just wafer).

At stage 102a, semiconductor structure 104 includes a substrate 106, copper-containing layer 108 formed over substrate 106, and a patterned layer no (at stage 102a, a to-be-patterned layer) formed above copper-containing layer 108 and substrate 106. Although these particular layers are shown and described, this disclosure contemplates semiconductor structure 104 including any suitable layers. For example, semiconductor structure 104 may include one or more intervening layers between substrate 106 and copper-containing layer 108 and/or between copper-containing layer 108 and patterned layer no.

Substrate 106 may be formed using any suitable semiconductor fabrication step or combination of semiconductor fabrication steps. Substrate 106 may include silicon, silicon germanium (SiGe), silicon carbide (SiC), compound semiconductors (e.g., gallium nitride (GaN), gallium arsenide (GaAs), indium arsenide (InGaAs), indium phosphide (InP), and others), or combinations of these materials. This disclosure contemplates substrate 106 including any suitable material. Substrate 106 may include a silicon-on-insulator (SOI) structure, a semiconductor wafer (e.g., a silicon wafer), or a die formed from a wafer. In certain embodiments, a portion or the entirety of substrate 106 may be amorphous, polycrystalline, or single-crystalline. Substrate 106 may be doped, undoped, or contain both doped and undoped regions.

Substrate 106 may include any suitable type of substrate. In certain embodiments, substrate 106 includes one or more IC elements, such as one or more transistors, one or more diodes, one or more capacitors, one or more resistors, and/or other electronic components. These IC elements can have any suitable design, including any suitable planar or non-planar and two-dimensional or three-dimensional (e.g., a fin field-effect transistor (FinFET), gate-all-around (GAA) FET, etc.) design. In certain embodiments, these IC elements may be front-end-of-line (FEOL) devices.

Furthermore, substrate 106 may include one or more metallization layers. In certain embodiments, whether or not considered a metallization layer (or as including a metallization layer), substrate 106 includes one or more conductive features, such as one or more conductive contacts, one or more conductive vias, one or more conductive lines, and/or one or more other conductive features.

Copper-containing layer 108 is formed over substrate 106. In certain embodiments, copper-containing layer 108 is made of pure copper (100% copper); however, this disclosure contemplates copper-containing layer 108 including copper with a certain amount of one or more other materials. In certain embodiments, copper-containing layer 108 includes 100% copper or includes copper and less than about 20 parts per million of one or more other materials (e.g., sulfur, chlorine, carbon, nitrogen, silver, aluminum, or another material). Copper-containing layer 108 may include metal or a metal alloy, and for purposes of this description, metal and metal alloy may be used interchangeably.

Copper-containing layer 108 is a layer that is to be patterned into one or more features that may serve as conductive features in a semiconductor device being fabricated through processing of semiconductor structure 104. This disclosure contemplates the feature(s) being etched into copper-containing layer 108 being any suitable feature(s). For example, although this disclosure primarily describes "recesses," it will be appreciated that other suitable features might be formed in copper-containing layer 108, including (whether or not considered "recesses") lines, holes, trenches, vias, and/or other suitable structures, using embodiments of this disclosure. In certain embodiments, copper-containing layer 108 is to be part of a back-end-of-line (BEOL) stack, such as a metallization layer of a BEOL stack.

Copper-containing layer 108 may be deposited using any technique appropriate for the material to be deposited. Suitable deposition processes used to form copper-containing layer 108 may include a spin-on coating process, a chemical vapor deposition (CVD) process, a plasma enhanced chemical vapor deposition (PECVD) process, an atomic layer deposition (ALD) process, a physical vapor deposition (PVD) process, a chemical solution deposition process, or other process(es).

In certain embodiments, one or more liner layers may be deposited (e.g., on surface of substrate 106) prior to depositing copper-containing layer 108. A liner layer, which also may be referred to as a barrier layer, may include, for example, a titanium nitride (TiN) layer and/or a tantalum nitride (TaN) layer, and may have a thickness of about 0.3 to about 3.5 nm. Any suitable number of liner layers may be used of any suitable types of materials. In certain embodiments, the one or more liner layers may be considered part of substrate 106 (e.g., as a surface layer of substrate 106). In certain embodiments, the one or more liner layers may reduce or eliminate copper diffusion to another layer (e.g., to other portions of substrate 106) and/or serve as an etch stop layer at an appropriate fabrication phase. One or more of the liner layers could be a capping layer, such as a cobalt (Co)-tungsten (W)-phosphorus (P) (CoWP) capping layer or a Co—W-boron (B) (CoWB) capping layer.

Semiconductor structure 104 includes patterned layer no. In the state illustrated at stage iota, patterned layer no is a to-be-patterned layer, as it has yet to be patterned. In certain embodiments, patterned layer no is made of a material suitable for use as a hardmask. For example, patterned layer 110 may include an organic (amorphous carbon, organosiloxane, etc.) or inorganic material (silicon nitride (SiN), silicon oxynitride (SiON), TiN, etc.). In certain embodiments, patterned layer no includes multiple layers of materials. Patterned layer no may be deposited using any technique appropriate for the material(s) to be deposited. Suitable deposition processes may include a spin-on coating process, a CVD process, a PECVD process, an ALD process, a PVD process, a chemical solution deposition process, or other process(es). For example, patterned layer no may be or include an amorphous carbon layer formed by a CVD or ALD process.

Turning to stage 102b, patterned layer 110 is patterned to provide a suitable mask for forming features (e.g., recesses) in an underlying layer (copper-containing layer 108 in this example). This disclosure contemplates patterning patterned layer no in any suitable manner.

As just one example, a photoresist layer may be formed over patterned layer 110 (e.g., prior to patterning patterned layer 110), and the photoresist layer may be patterned according to the desired pattern for patterned layer 110, to facilitate formation of respective features in patterned layer 110. The photoresist layer may be patterned in any suitable manner, such as using extreme ultraviolet lithography or any other suitable lithographic technique.

In certain embodiments one or more intervening layers may be formed between the photoresist layer and patterned layer 110 (prior to patterning patterned layer 110) for a variety of purposes. Such intervening layers could include, for example, an SiON layer, an organic dielectric layer, a silicon anti-reflective coating (SiARC) or other anti-reflective coating, and/or any other suitable intervening layers. Although these particular intermediate layers are described, semiconductor structure 104 may lack such intermediate layers or include different intermediate layers (with or without these example intermediate layers).

Patterned layer 110 may be formed by performing an etch process and using the photoresist layer (and any suitable intervening layers) as an etch mask. Through this technique, a pattern defined by the photoresist layer is transferred to patterned layer 110. The photoresist layer and any intervening layers may be removed as part of this process, or may be subsequently removed. In certain embodiments, patterned layer 110 is to serve as an etch mask when forming features from copper-containing layer 108. In other words, features of patterned layer 110 may cause corresponding features of copper-containing layer 108 to remain during a subsequent etch process, as described below. For example, patterned layer 110 includes recesses 112, which will be used to form corresponding recesses 112 in copper-containing layer 108 in subsequent stages of process 100. Furthermore, patterned layer 110 may facilitate preserving portions of copper-containing layer 108 in subsequent etch steps to form conductive features (e.g., conductive lines, vias, or contacts) of those preserved portions.

Turning to the stages that follow stage 102b in process 100, as shown in FIG. 1B embodiments of this disclosure use a cyclic etch process 113 to pattern copper-containing layer 108, using patterned layer no as an etch mask in this example. In the embodiment illustrated in FIGS. 1A-1C (and, in particular, in FIG. 1B), cyclic etch process 113 includes two primary steps. A first step, as shown at stage 102C for example, is a passivation layer formation step in which, using a chlorine gas, a passivation layer is formed at one or more exposed surfaces of copper-containing layer 108. A second step, as shown stage 102d for example, is an etch step in which the passivation layer is removed from a least a portion of the copper-containing layer 108 thereby removing at least a portion of the copper-containing layer 108. Stages 102c and 102d are described in greater detail below. In certain embodiments, prior to one or more occurrences of stage 102C, a surface oxide may be present on exposed surfaces of copper-containing layer 108. A suitable removal process, such as an argon sputtering step, may be performed to substantially or entirely remove the surface oxide.

At stage 102C, in the first etch step of cyclic etch process 113, a passivation layer 116 is formed at least at portions of copper-containing layer 108. In certain embodiments, passivation layer 116 is formed on exposed surfaces of copper-containing layer 108. At an initial pass of cyclic etch process 113, exposed surfaces of copper-containing layer 108 may be a top surface 114 of copper-containing layer 108 (e.g., at a bottom of a recess in patterned layer no that exposes copper-containing layer 108), and passivation layer 116a may be formed at that exposed top surface of copper-containing layer 108. On subsequent passes through cyclic etch process 113, additional surfaces of copper-containing layer 108 are exposed, and passivation layer 116 also may be formed at those additional exposed surfaces of copper-containing layer 108 (e.g., as illustrated and described later as passivation layer 116b and 116c). For ease of description, passivation layer 116 may be referred to generally as passivation layer 116, and in certain cases with particularity to passivation layer 116a, 116b, and/or 116c, as may be appropriate for a given usage. Formation of passivation layer 116 on sidewall surfaces of copper-containing layer 108, for example, is illustrated and described below with reference to FIGS. 2A-2E.

Passivation layer 116 may be formed by exposing semiconductor structure 104 (and thereby exposed surfaces, such as top surfaces 114, of copper-containing layer 108) to a chlorine treatment 115 that includes chlorine gas ($Cl_2$). Passivation layer 116 may include a compound formed from copper atoms at exposed surfaces (e.g., top surfaces 114) of copper-containing layer 108 and the $Cl_2$ to which those copper atoms are exposed. Passivation layer 116 may include $Cu_yCl_x$ structures formed at one or more exposed surfaces (e.g., top surfaces 114) of copper-containing layer 108. For example, one or more chlorine particles may bond to one or more copper atoms at or near a surface of copper-containing layer 108 to form $Cu_yCl_x$ structures (e.g., moieties or soft surface states) at or near the surface of copper-containing layer 108 and thereby form passivation layer 116. Thus, passivation layer 116 consumes at least a portion of copper-containing layer 108 such that the subsequent etching of passivation layer 116 (e.g., in stage 102d of cyclic etch process 113) removes a portion of copper-containing layer 108. For the formed $Cu_yCl_x$ structures, y and x are integers greater than or equal to 1. In certain embodiments, one or more of the following is true: $1 \leq y \leq 6$; or $1 \leq x \leq 6$. As just a few particular examples, the formed $Cu_yCl_x$ structures may include CuCl, $CuCl_2$, CuCl 3, $CuCl_4$, $Cu_2Cl$, and/or $Cu_3Cl$. It should be understood that these values for y and x and their combinations are provided as examples only.

Neutral chlorine gas ($Cl_2$) may combine with copper in a self-limiting manner. Exposing exposed surfaces of copper-containing layer 108 to chlorine gas may form a self-limited passivation layer 116 of a compound of chlorine and copper at the exposed surfaces of copper-containing layer 108. In certain embodiments, exposing exposed surfaces of copper-containing layer 108 to chlorine gas may form a monolayer of the compound of chlorine and copper at the exposed surfaces of copper-containing layer 108. It should be understood that a monolayer does not necessarily imply that one-hundred percent coverage of the compound of chlorine and copper is achieved.

Passivation layer 116 may be formed in any suitable manner. This disclosure contemplates exposing semiconductor structure 104 (and thereby exposed surfaces of copper-containing layer 108) to chlorine treatment 115 (e.g., chlorine gas) in any suitable manner, including, for example, using a thermal process, a plasma process, or any other suitable type of process. That is, chlorine treatment 115 may be implemented as a thermal process, a plasma process, or any other suitable type of process.

In certain embodiments, chlorine treatment 115 is a thermal process that includes exposing semiconductor structure 104 (and thereby exposed surfaces of copper-containing layer 108) to chlorine gas a suitable temperature to cause $Cu_yCl_x$ structures to form at one or more exposed surfaces (e.g., top surfaces 114) of copper-containing layer 108.

In certain embodiments, chlorine treatment 115 is a plasma process that includes forming a plasma from chlorine gas and exposing semiconductor structure 104 (and thereby exposed surfaces of copper-containing layer 108) to chlorine gas of the generated plasma to cause $Cu_yCl_x$ structures to form at one or more exposed surfaces (e.g., top surfaces 114) of copper-containing layer 108.

The process used to form passivation layer 116 may be an anisotropic process or an isotropic process, according to particular implementations. An anisotropic process, such as an anisotropic plasma process, may result in passivation layer 116 being formed only at certain exposed surfaces of copper-containing layer 108 or, alternatively, being formed at different thicknesses on different surfaces of copper-containing layer 108, as desired. An isotropic process, such as an isotropic plasma process or thermal process, may result in formation of a passivation layer 116 that has a generally uniform (though not necessarily identical) thickness on potentially all exposed surfaces of copper-containing layer 108.

Turning to stage 102d, in the second etch step of cyclic etch process 113, some or all of passivation layer 116 is etched to incrementally form/extend recesses 112 in copper-containing layer 108. In certain embodiments, the process to etch passivation layer 116 is a plasma etch process that uses a plasma generated from a noble gas, such as argon, that selectively etches passivation layer 116 relative to copper.

In certain embodiments (e.g., such as may be the case when the objective is to extend recess 112 through to substrate 106), the etch step of stage 102d is designed to be selective so that it removes portions of copper-containing layer 108 through recesses 112 without etching (or with minimal etching of) a top material of substrate 106 when recesses 112 opens to substrate 106. Thus, in such an example, the etch step of cyclic etch process 113 is designed to self-terminate once recesses 112 in copper-containing layer 108 are fully formed such that a top surface of substrate 106 is exposed at the bottom of recesses 112 in some embodiments.

In certain embodiments, the etch step of stage 102d is a plasma etch step performed using a plasma 118. In a particular example, plasma 118 used to etch passivation layer 116 includes argon or another noble gas. Additional details of an example etch process of stage 102d are described below in combination with an example passivation layer 116 deposition process of stage 102c.

The etch step of stage 102d may initially reveal or further reveal additional surfaces of copper-containing layer 108. For example, the etch step of stage 102d may initially reveal or further reveal surfaces of sidewalls 119 of copper-containing layer 108 in recesses 112. Once revealed (e.g., after recesses 112 have opened into copper-containing layer 108, exposing surfaces at sidewalls 119 of copper-containing layer 108 in recesses 112), passivation layer 116 may be formed on such additional surfaces (e.g., surfaces of sidewalls 119) during subsequent executions of stage 102C. In certain embodiments, prior to cyclic etch process 113 and without first forming passivation layer 116, a partial etch of copper-containing layer 108 may be performed to begin forming recesses 112 in copper-containing layer 108 according to the pattern defined by patterned layer no. In other embodiments, no such partial etch is first performed.

The etch process used in the etch step of stage 102d may be an anisotropic etch process, according to particular implementation objectives. An anisotropic etch process, such as an anisotropic plasma process, may etch in a particular direction, such as a downward direction in recesses 112 to further extend recesses 112 into copper-containing layer 108, by removing passivation layer 116a at top surfaces 114 of copper-containing layer 108.

As shown by circular arrows 120, the steps of cyclic etch process 113 (e.g., the passivation layer 116 formation step of stage 102C and the etch step of stage 102d) may be repeated one or more times to incrementally form recesses 112 in copper-containing layer 108. It should be understood that this disclosure contemplates performing cyclic etch process 113 any suitable number times.

In certain embodiments, each cycle through cyclic etch process 113 is capable of further extending recesses 112 into copper-containing layer 108. The appropriate number of cycles for performing cyclic etch process 113 for a given implementation depends on a variety of factors, including the exact material of copper-containing layer 108; the material of passivation layer 116; the desired dimensions of recesses 112; the acceptable amount of time that cyclic etch process 113 may introduce to the entire process of fabricating semiconductor structure 104; the substance(s) (e.g., gas(es)) used as part of cyclic etch process 113, including the substance(s) used to deposit passivation layer 116 and the substance(s) used to etch passivation layer 116; and/or other suitable factors.

In certain embodiments, the appropriate number of cycles for performing cyclic etch process 113 is predetermined (prior to production fabrication runs) by processing test wafers. A wafer (e.g., semiconductor structure 104) may be sampled at a variety of stages to measure aspects of the wafer, including dimension of the feature being etched (e.g., recesses 112) and one or more possible pattern defects. For example, samples may be analyzed after one or more of stages 102.

As a more particular example, a first wafer may be sampled after a first predetermined number of cycles of cyclic etch process 113, stopping after an instance of the etch step of stage 102d, and the measurements of characteristics such as critical dimension of recesses 112 and for possible pattern defects may be compared to desired values for those characteristics (e.g., to a technology node parametric). Furthermore, a determination may be made whether a surface of substrate 106 is exposed at the bottoms of recesses 112 (referenced below as top surface 122). A determination then may be made whether to test a new wafer after a second predetermined number of cycles that is either less than or greater than the first predetermined number of cycles, depending on the results of the comparisons and other factors (e.g., such as any one of the other above-listed factors). This process of sampling may be repeated until a suitable number of cycles is determined for a given implementation.

Furthermore, adjustments to the steps of cyclic etch process 113 may be determined as part of this testing and analysis. For example, different exposure times of semiconductor structure 104 to chlorine treatment 115 and/or plasma 118 may be analyzed to determine the effect on dimensions of recesses 112, time of cyclic etch process 113, and/or other factors.

Characteristics, such as dimensions of semiconductor structure 104 may be measured using optical techniques such as scatterometry, a scanning electron microscope (SEM), transmission electron microscope (TEM), high-resolution TEM (HR-TEM), scanning probe microscope (SPM), atomic force microscope (AFM), scanning tunneling microscope (STM), or other suitable device.

The above-described technique for determining an appropriate number of cycles of cyclic etch process 113 is an example only. This disclosure contemplates any suitable technique for determining an appropriate number of cycles for performing cyclic etch process 113.

Turning to the process conditions and associated parameters for the passivation layer 116 formation step of stage 102C and the etch step of stage 102d, as described above, in certain embodiments, both the passivation layer 116 formation step of stage 102C and the etch step of stage 102d are performed using plasma processes. In certain other embodiments, the passivation layer 116 formation step of stage 102C may be performed using a thermal deposition process (or another suitable type of deposition process) and the etch step of stage 102d may be performed using a plasma process.

In certain embodiments, the steps of cyclic etch process 113 (e.g., deposition and etch associated with stages 102C and 102d) may be executed in a same process chamber of a process tool. As examples, the process tool may be an inductively coupled plasma (ICP) tool, a capacitively coupled plasma (CCP) tool, a helicon wave source (HWS) tool, a helical resonator, a spiral resonator, a microwave or e-beam generating plasma tool, a thermal processing tool, or any other suitable type of tool or combination of types of tools. A purge of the gases within the process chamber might or might not be performed between the steps of cyclic etch process 113, depending on implementation details. For example, purging the process chamber between stages 102C and 102d of cyclic etch process 113 may reduce the opportunity for gases used in the passivation layer 116 (stage 102c) to remain in the process chamber during the etch step (stage 102d) and interfere with the etch step. As another example, given the cyclic nature of cyclic etch process 113, purging the process chamber between stages 102d and a recurrence of stage 102C of cyclic etch process 113 may reduce the opportunity for gases used in the etch step (stage 102d) to remain in the process chamber during the passivation layer 116 formation step (stage 102c) and interfere with the passivation layer 116 formation step. Alternatively, this disclosure contemplates not performing a purge at one or both of these times (between stages 102C and 102d and/or between stages 102d and a recurrence of stage 102c). For example, in addition to or in place of a purge, the noble gas plasma activation (e.g., turning on the Ar or other noble gas radio frequency (RF)) associated with stage 102d may be delayed (e.g., by about 1 second or more) following termination of the chlorine gas flow associated with stage 102C to reduce or eliminate chlorine gas disassociation that might occur during the etch process associated with stage 102d.

In certain embodiments, the steps of cyclic etch process 113 (e.g., deposition and etch associated with stages 102C and 102d) may be executed in different process chambers of a same process tool. As examples, the process tool may be an ICP tool, a CCP tool, an HWS tool, a helical resonator, a spiral resonator, a microwave or e-beam generating plasma tool, a thermal processing tool, or any other suitable type of tool or combination of types of tools. For example, stage 102C may be performed in a first chamber of the process tool (e.g., a plasma chamber or a thermal process chamber) and stage 102d may be performed in a separate plasma chamber of the same process tool.

In certain embodiments, the steps of cyclic etch process 113 (e.g., passivation and etch associated with stages 102C and 102d, respectively) may be executed in process chambers of different process tools. As examples, the process tools may be any suitable combination of ICP tools, CCP tools, HWS tools, helical resonators, spiral resonators, microwave or e-beam generating plasma tools, thermal processing tools, or any other suitable types of tools or combinations of types of tools. For example, stage 102C may be performed in a chamber of a first process tool (e.g., a plasma chamber or a thermal process chamber) and stage 102d may be performed in a plasma chamber of a separate process tool.

Example process conditions and associated parameters to be considered include: the process tool parameters for each of stage 102C and stage 102d (e.g., if applicable depending on the type of process, the gases and respective amounts to be introduced into a process chamber in each of stages 102C and 102d, the pressure to be applied in each of stages 102C and 102d, the source RF power and bias RF power to be used in each of stages 102C and 102d, the temperature for each of stages 102C and 102d, the time for each of stages 102C and 102d, the number of times to perform each of stages 102C and 102d (e.g., the number of cycles), whether the process parameters are different for any instances of stages 102C and 102d, whether to purge a process chamber between process steps (in embodiments in which stages 102C and 102d are performed in the same process chamber), whether an anisotropic passivation and/or etch process is to be used and associated process conditions, a desired amount of extension of recesses 112 into copper-containing layer 108, and/or any other process conditions and associated parameters.

The selected process conditions and associated parameters may be determined according to a variety of factors, such as certain of those factors described above with reference to determining an appropriate number of cycles of cyclic etch process 113. Furthermore, the selected process conditions and associated parameters for stages 102C and 102d may be optimized with respect to each other. For example, to achieve the optimal combination of processes that achieves one or more of the above-described factors, it may be appropriate to consider the process conditions and associated parameters for the passivation (stage 102c) and etch (stage 102d) in combination.

Particular example process conditions for example cyclic etch process 113 are described below. Passivation layer 116 may be formed at stage 102C using a thermal deposition process or a plasma deposition process, and the etch step may be performed at stage 102d using a plasma process. These process conditions are provided for example purposes only. This disclosure contemplates using any suitable process conditions for performing cyclic etch process 113, according to particular implementation objectives.

In certain embodiments, the passivation layer 116 formation step of stage 102C (e.g., chlorine treatment 115) is implemented as a thermal deposition process, and may include introducing chlorine gas ($Cl_2$) into a process chamber and elevating the temperature of semiconductor structure 104 to a temperature in a range of about 100° C. to about 300° C. to cause the $Cl_2$ to disassociate and react with one or more exposed surfaces of the copper-containing layer to form the $Cu_yCl_x$ structures (passivation layer 116).

In certain embodiments, the passivation layer 116 formation step of stage 102C (e.g., chlorine treatment 115) is implemented as a plasma deposition process and may include introducing chlorine gas ($Cl_2$) into a process chamber and generating a plasma that includes chlorine gas ($Cl_2$). In certain embodiments, the plasma is generated using a relatively high pressure (e.g., greater than about 200 millitorr (mTorr)). In certain embodiments, the plasma is generated using a pressure greater than about 300 mTorr. A high pressure discharge may reduce the energy of ions being directed at the exposed surface of copper-containing layer 108 (e.g., at top surface 114), as such ion bombardment could result in alloying at the exposed surfaces of copper-containing layer 108, thereby undesirably modifying the surface morphology of copper-containing layer 108.

In certain embodiments, chlorine is the only gas deliberately introduced to form the plasma. In certain other embodiments, chlorine gas and one or more other gases may be used to form the plasma. For example, a relatively small amount of a noble gas (e.g., argon) may be added to the plasma chamber (in addition to the chlorine gas) to facilitate ignition of the plasma.

As just one particular example, a plasma deposition process for forming passivation layer 116 may include chlorine gas ($Cl_2$) at a flow rate of about 100 standard cubic centimeters per minute (sccm) to about 300 sccm, a pressure of about 50 mTorr to about 300 mTorr, source power of about 10 W to about 60 W, bias power of about 10 W to about 50 W, and a temperature increased to about 100° C.

In certain embodiments, the etch step of stage 102d is implemented as a plasma process (e.g., plasma 118), and may include introducing a noble gas (e.g., argon) into a process chamber and generating plasma 118 using the argon gas. Other example noble gases that could be used include helium and xenon, but using argon may provide certain cost benefits. In certain embodiments, the noble gas (e.g., argon) is the only gas deliberately introduced to form plasma 118. In certain other embodiments, chlorine gas and one or more other gases may be used to form the plasma. In certain embodiments, the power conditions under which plasma 118 is generated attempt to strike a balance between absorption and sputtering. For example, the power may be set sufficiently high to facilitate absorption of compounds of passivation layer 116 (e.g., of CuCl), but low enough to attempt to keep ion sputtering at an acceptable and/or minimized level. As just one example, it may be desirable to keep ion energy to less than about 40 eV, and in certain embodiments less than about 20 eV. As another example, relatively low pressure (e.g., ≤about 10 mTorr) may be used to etch passivation layer 116, and the ability to accomplish this etching at such as low pressure may mitigate the risk of etch by-product redeposition.

As just one particular example, a plasma process for etching passivation layer 116 may include a pressure of about 10 mTorr to about 100 mTorr, a source power of about 50 W to about 100 W, a bias power of about 10 W to about 50 W, an Ar flow rate of about 300 sccm, a temperature of about 100° C. or less, and an ion energy of about 10 eV to about 40 eV.

In a first particular example embodiment in which stage 102C is a thermal process and stage 102d is a plasma process, process conditions and associated parameters for the passivation layer 116 formation step (stage 102c) and the etch step (stage 102d) of cyclic etch process 113 may include the following. Example process conditions for stage 102C may include: a passivation time of ≤about 5 seconds, a $Cl_2$ flow rate of about 100 sccm to about 300 sccm, and a temperature of about 100° C. to about 300° C. Example process conditions for stage 102d may include (e.g., in a CCP tool): an etch time of ≤about 5 seconds, a pressure of 100 mTorr, a source power of about 50 W to about 100 W, a bias power of about 10 W to about 50 W, a temperature of about 100° C. or less, and an Ar flow rate of about 300 sccm. In one example, cyclic etch process 113 is performed in different process chambers (of the same or different process tools).

In a second particular example embodiment in which stage 102C is a plasma process and stage 102d is a plasma process, process conditions and associated parameters for the passivation layer 116 formation step (stage 102c) and the etch step (stage 102d) of cyclic etch process 113 may include the following. Example process conditions for stage 102C may include: a passivation time of ≤about 5 seconds, a pressure of >200 mTorr, a source power of about 10 W to about 60 W, a bias power of about 10 W to about 50 W, a temperature of about 100° C., and a $Cl_2$ flow rate of about 100 sccm to about 300 sccm. Example process conditions for stage 102d may include (e.g., in a CCP tool): an etch time of ≤about 5 seconds, a pressure of 100 mTorr, a source power of about 50 W to about 100 W, a bias power of about 10 W to about 50 W, a temperature of about 100° C. or less, and an Ar flow rate of about 300 sccm. In one example, cyclic etch process 113 is performed in different process chambers (of the same or different process tools). In another example, cyclic etch process 113 is performed in a same process chamber, with a purge being executed between stages 102C and 102d, and between stages 102d and a return to stage 102C for another cycle. The time for the purge may depend on the pressure used and the process chamber volume.

At stage 102e of FIG. 1C, cyclic etch process 113 has completed and recesses 112 in copper-containing layer 108 have been completely formed, which in this example includes top surface 122 of substrate 106 being exposed at the bottoms of recesses 112. Additionally, portions of passivation layer 116 (e.g., passivation layers 116b and 116c) remain on sidewalls 119 of copper-containing layer 108 in recesses 112. As described above, passivation layer 116 (and particularly passivation layer 116b and 116c) may form on surfaces of sidewalls 119 when recesses 112 open to copper-containing layer 108, thereby causing the surfaces of sidewalls 119 to become exposed surfaces during a subsequent passivation step of stage 102C. In certain embodiments, passivation layers 116b and 116c may be partially or wholly removed from sidewalls 119 using a "cleaning" etch. As just one example, a cleaning etch can be performed using argon or another suitable material. Such a cleaning etch could be implemented using any suitable dry etch process, wet etch process, or a combination thereof.

Remaining portions of copper-containing layer 108 may form structures 123a, 123b, and 123c (referred to generally as structures 123). Structures 123 may be formed to serve as conductive features of a semiconductor device being formed. Such conductive features may be, for example, conductive lines, vias, contacts, or the like. This disclosure contemplates structures 123 being any suitable types of conductive features. Furthermore, the type of conductive feature may be different for one or more of structures 123a, 123b, and 123c.

At stage 102f, as shown in FIG. 1C, recesses 112 may be filled with a suitable fill material 124. In certain embodiments, fill material 124 includes a dielectric material, to isolate remaining portions of copper-containing layer 108 from one another for example. Particular example dielectric materials may include any material suitable for use as a pre-metal dielectric (PMD), an intermetal dielectric (IMD), an interlayer dielectric (ILD), or the like. This disclosure contemplates fill material 124 including any suitable dielectric material or combination of dielectric materials. As particular examples, the dielectric material may include SiN; SiON; silicon dioxide ($SiO_2$); silicon, carbon, oxygen, hydrogen (SiCOH), or any other suitable dielectric material or combination of dielectric materials.

In certain embodiments, one or more additional materials may be deposited prior to depositing the dielectric material. For example, one or more barrier layers, such as a thin alloy layer, may be deposited prior to filling the remainder of recesses 112 with the dielectric material. Such barrier layers may serve a variety of purposes, including, for example, mediation of electromigration at sidewalls 119 of copper-containing layer 108 between copper-containing layer 108 and the to-be-deposited dielectric material of fill material 124. Example barrier layers include TaN or TiN. When initially deposited, the barrier layer may cover semiconductor structure 104, including over top surfaces of semiconductor structure 104. The portions of the barrier layer that are over top portions of semiconductor structure 104 may be removed, using any suitable etching technique (e.g., an anisotropic etch technique), leaving the portion of the barrier layer over surfaces of sidewalls 119 in recesses 112. Any other suitable materials, including a dielectric material, may then be used to fill a remainder of recesses 112.

Although the version of semiconductor structure 104 shown at stage 102f includes remaining portions of patterned layer 110 (at tops of structures 123), remaining portions of patterned layer no might or might not be removed, according to particular implementations. In embodiments in which remaining portions of patterned layer no are removed, remaining portions of patterned layer no may be removed prior to or following stage 102f.

At stage 102f, remaining portions of copper-containing layer may then serve as a conductive feature in a resulting semiconductor device. For example, the remaining portions of copper-containing layer 108 may serve as a conductive contact, a conductive via, a conductive line, or any other suitable type of conductive feature.

Although process 100 is shown as including particular stages, this disclosure contemplates process 100 including additional or fewer stages as might be appropriate for a particular implementation. For example, process 100 might include purge stages between stages 102C and 102d and between stages 102d and a return to 102c.

Embodiments of this disclosure may provide one or more technical advantages. Particular embodiments may provide some, none, or all of these advantages.

In certain embodiments, the cyclic nature of cyclic etch process 113 facilitates etching copper-containing layer 108 in an incremental manner. The cyclic etch process 113 of certain embodiments provides an incremental copper etch process that can be tightly controlled due to the layer-by-layer etching approach, and provides reduction or elimination of morphology changes to a surface of the copper layer being etched. Additionally, the minimal-to-no morphology changes to the copper surface provided by certain embodiments may reduce or eliminate surface roughness on copper-containing layer 108 (and the resulting structures 123 made from copper-containing layer 108) and an improved profile of the resulting structures 123 made from copper-containing layer 108. Furthermore, the passivation layer 116 formation step (e.g., exposing surfaces of copper-containing layer 108 to chlorine treatment 115) may be self-limiting, and the etch performed using plasma 118 may be highly selective to etch passivation layer 116, both of which also may reduce or eliminate surface roughness on copper-containing layer 108 (and the resulting structures 123 made from copper-containing layer 108) and an improved profile of the resulting structures 123 made from copper-containing layer 108. That is, the self-limited nature of passivation layer 116, and the selectivity of plasma 118 to etch passivation layer 116, may facilitate controlling the rate of etching of recesses 112 in copper-containing layer 108, while reducing or eliminating pattern defects in copper-containing layer 108.

Certain embodiments provide a technique for etching copper that is suitable for use in high volume manufacturing. For example, certain embodiments provide an incremental and self-limiting process that can be incorporated into a larger process for forming a semiconductor device. As another example, relative to other attempts to etch copper in a subtractive manner, certain embodiments reduce or eliminate damage to the copper layer and/or to other portions of a semiconductor structure being processed.

In addition to other types of features, certain embodiments provide an ability to etch a relatively deep recess 112 to form a high aspect ratio conductive feature in which the depth of the recesses 112 is significantly greater than a width of the recess, possibly significantly greater. Due at least in part to the controllable nature of the etch process, certain embodiments may be capable of use for advanced packaging and three-dimensional (3D) integration (e.g., for fin field-effect transistors (FinFETs), gate all-around (GAA) transistors, 3D NAND devices, etc.).

FIGS. 2A-2E illustrate cross-sectional views of semiconductor structure 104 during cyclic etch process 113 for processing semiconductor structure 104, according to certain embodiments of this disclosure. In particular, FIGS. 2A-2E illustrate semiconductor structure 104 during five example iterations of cyclic etch process 113 to illustrate layer-by-layer removal of portions of copper-containing layer 108. These five iterations of stages 102C and 102d are labeled stages 102c(1) and 102d(1) for iteration 1, stages 102c(2) and 102d(2) for iteration 2, stages 102c(3) and 102d(3) for iteration 3, stages 102c(4) and 102d(4) for iteration 4, and stages 102c(5) and 102d(5) for iteration 5. A particular number of iterations are shown for example purposes only.

In general, aspects of stage 102c(1) through 102c(5) correspond to aspects of stage 102C described above with reference to FIG. 1B, and for simplicity many details are not repeated. Additionally, in general, aspects of stage 102d(1) through 102d(5) correspond to aspects of stage 102d described above with reference to FIG. 1B, and for simplicity many details not repeated.

Figure 2A:
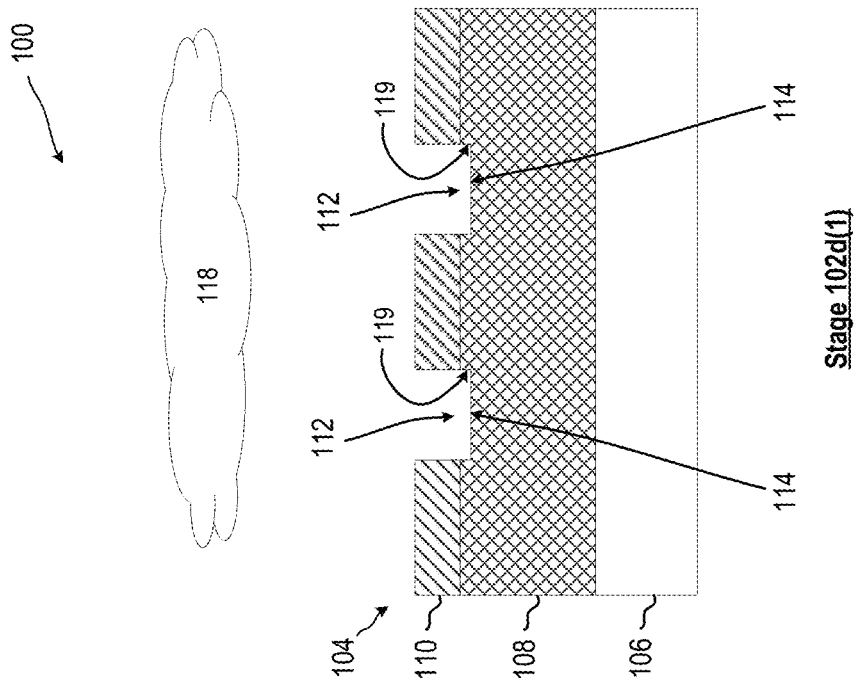
FIGS. 2A-2E illustrate cross-sectional views of a semiconductor structure during a cyclic etch process for processing the semiconductor structure, according to certain embodiments of this disclosure.
Figure 2A:
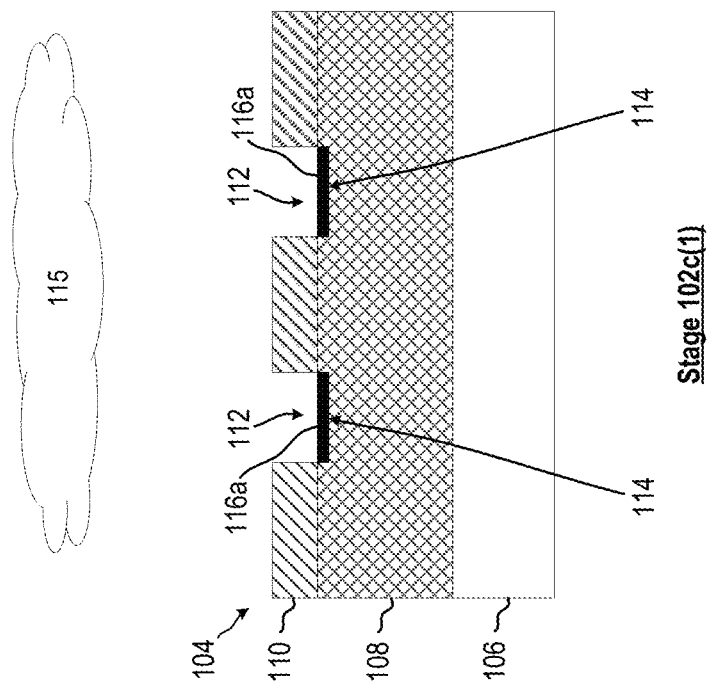

As shown in FIG. 2A, at stage 102c(1), top surfaces 114 of copper-containing layer 108 are exposed to chlorine treatment 115 at an opening of recesses 112 defined by patterned layer 110, causing passivation layer 116 to form on those exposed top surfaces 114. At stage 102d(1), the passivation layer 116 formed at stage 102c(1) is wholly or partially removed by exposing semiconductor structure 104 to plasma 118. Because passivation layer 116 consumes some portion of copper-containing layer 108, removing passivation layer 116 formed at top surfaces 114 of copper-containing layer 108 removes a portion of copper-containing layer 108, extending recesses 112 into copper-containing layer 108 and also exposing sidewalls 119 of copper-containing layer 108 in recesses 112.

Figure 2B:
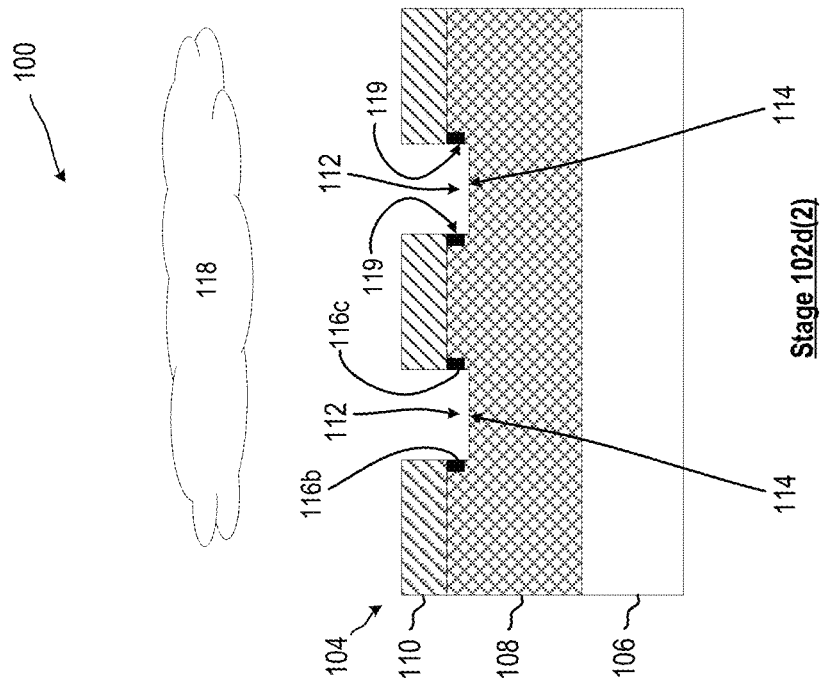
Figure 2B:
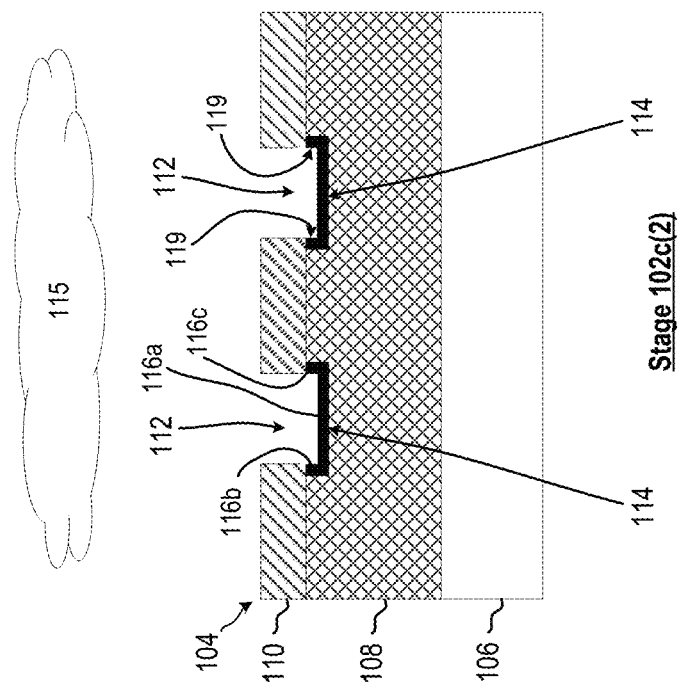

As shown in FIG. 2B, at stage 102c(2), top surfaces 114 of copper-containing layer 108 and surfaces of sidewalls 119 of copper-containing layer 108 are exposed to chlorine treatment 115, causing passivation layer 116a to form on those exposed top surfaces of copper-containing layer 108 at the bottom of recesses 112 and causing passivation layer 116b and 116c to form on surfaces of sidewalls 119 of copper-containing layer 108. At stage 102d(2), passivation layer 116a is wholly or partially removed by exposing semiconductor structure 104 to plasma 118. Because passivation layer 116a consumes some portion of copper-containing layer 108, removing passivation layer 116a formed at top surfaces 114 of copper-containing layer 108 removes a portion of copper-containing layer 108, extending recesses 112 into copper-containing layer 108 and also exposing more of sidewalls 119 of copper-containing layer 108 in recesses 112. In certain embodiments, due to the directional nature of applying plasma 118, directed at the top surfaces 114 of copper-containing layer 108 at the bottoms of recesses 112 (and the passivation layer 116a formed thereon), some or all of passivation layers 116b and 116c may remain at surfaces of sidewalls 119. It should be noted that when passivation layer 116a is formed on top surfaces 114 of copper-containing layer 108, passivation layer 116a may also be considered to be the top surfaces 114 of copper-containing layer 108.

Figure 2C:
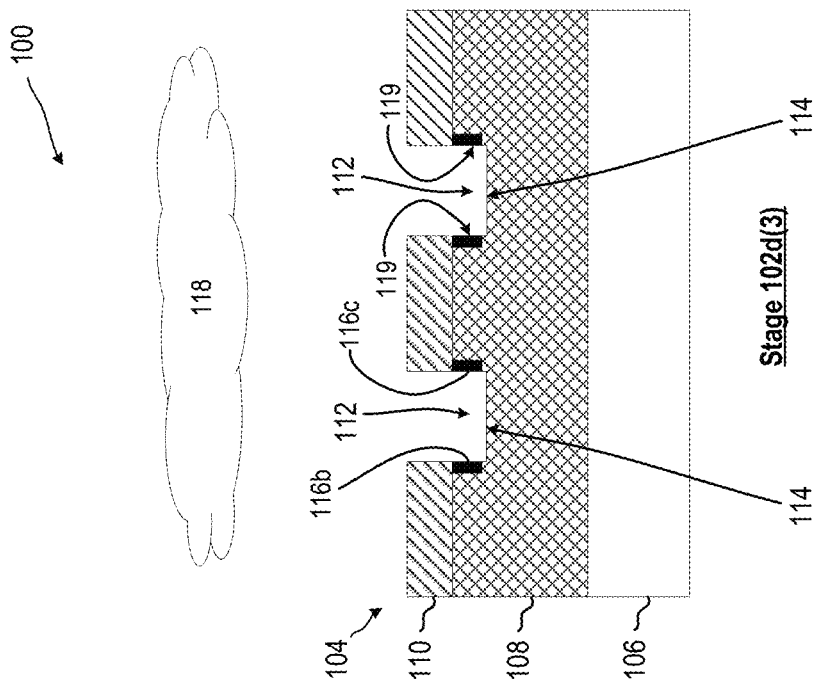
Figure 2C:
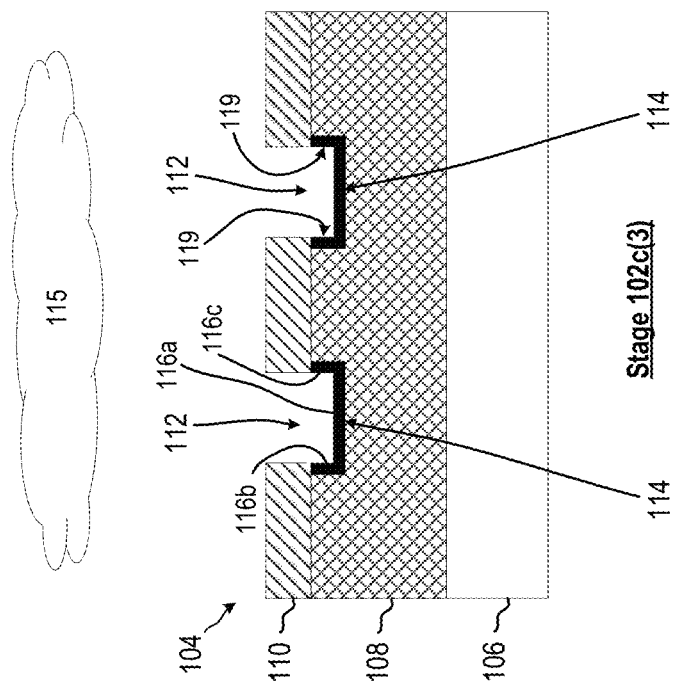

As shown in FIG. 2C, at stage 102c(3), top surfaces 114 of copper-containing layer 108 and surfaces of sidewalls 119 of copper-containing layer 108 are exposed to chlorine treatment 115, causing passivation layer 116a to form on exposed top surfaces 114 of copper-containing layer 108 and causing passivation layers 116b and 116c to form on portions of surfaces of sidewalls 119 that were exposed at stage 102d(2). At stage 102d(3), passivation layer 116a is wholly or partially removed by exposing semiconductor structure 104 to plasma 118. Because passivation layer 116a consumes some portion of copper-containing layer 108, removing passivation layer 116a formed at top surfaces of copper-containing layer 108 (at the bottom of recesses 112) removes a portion of copper-containing layer 108, extending recesses 112 into copper-containing layer 108 and also exposing more of sidewalls 119. In certain embodiments, due to the directional nature of applying plasma 118, directed at top surfaces 114 of copper-containing layer 108 at the bottoms of recesses 112 (and the passivation layer 116a formed thereon), some or all of passivation layers 116b and 116c may remain at surfaces of sidewalls 119.

Figure 2D:
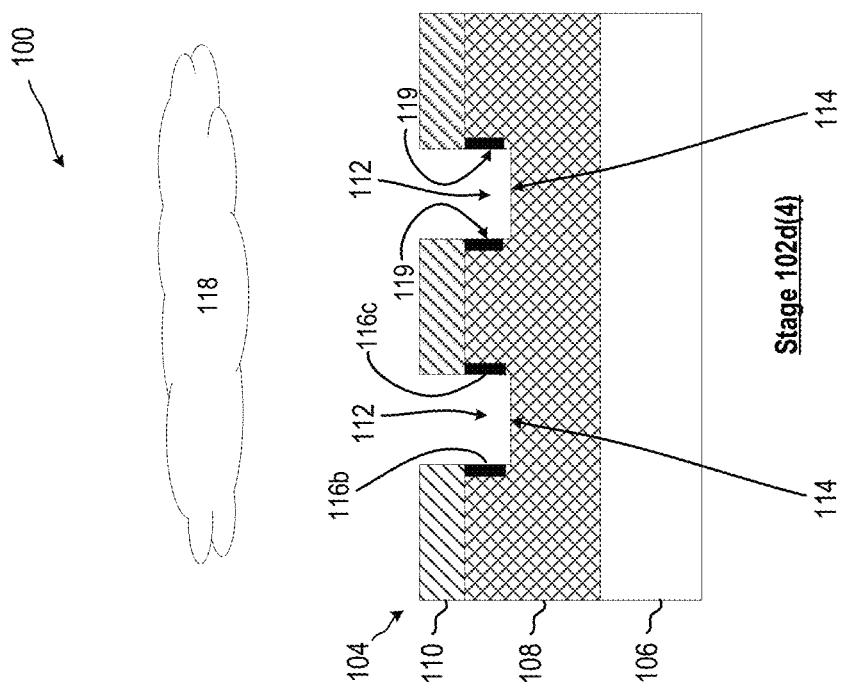
Figure 2D:
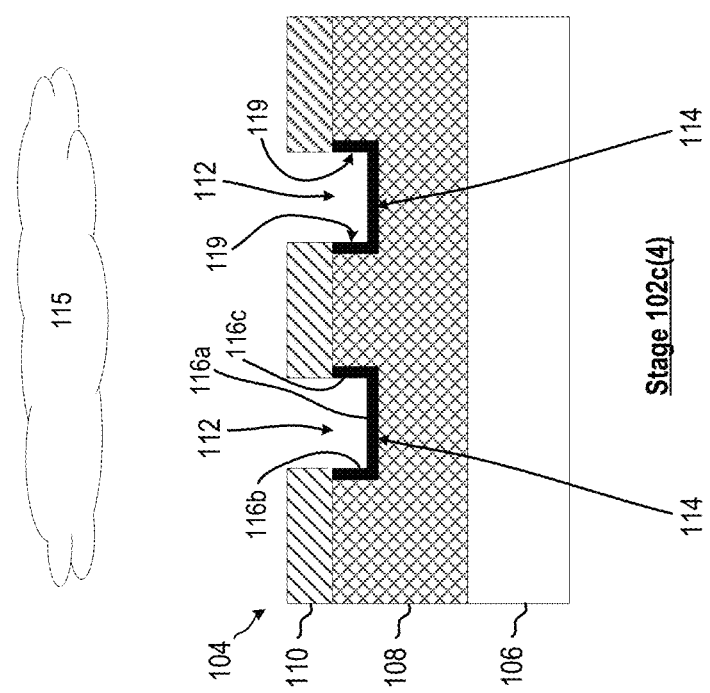

As shown in FIG. 2D, at stage 102c(4), top surfaces 114 of copper-containing layer 108 and surfaces of sidewalls 119 of copper-containing layer 108 are exposed to chlorine treatment 115, causing passivation layer 116a to form on exposed top surfaces 114 of copper-containing layer 108 and causing passivation layers 116b and 116c to form on portions of surfaces of sidewalls 119 that were exposed at stage 102d(3). At stage 102d(4), passivation layer 116a is wholly or partially removed by exposing semiconductor structure 104 to plasma 118. Because passivation layer 116a consumes some portion of copper-containing layer 108, removing passivation layer 116a formed at top surfaces 114 of copper-containing layer 108 (at the bottom of recesses 112) removes a portion of copper-containing layer 108, extending recesses 112 into copper-containing layer 108 and also exposing more of sidewalls 119. In certain embodiments, due to the directional nature of applying plasma 118, directed at top surfaces 114 of copper-containing layer 108 at the bottoms of recesses 112 (and the passivation layer 116a formed thereon), some or all of passivation layers 116b and 116c may remain at surfaces of sidewalls 119.

Figure 2E:
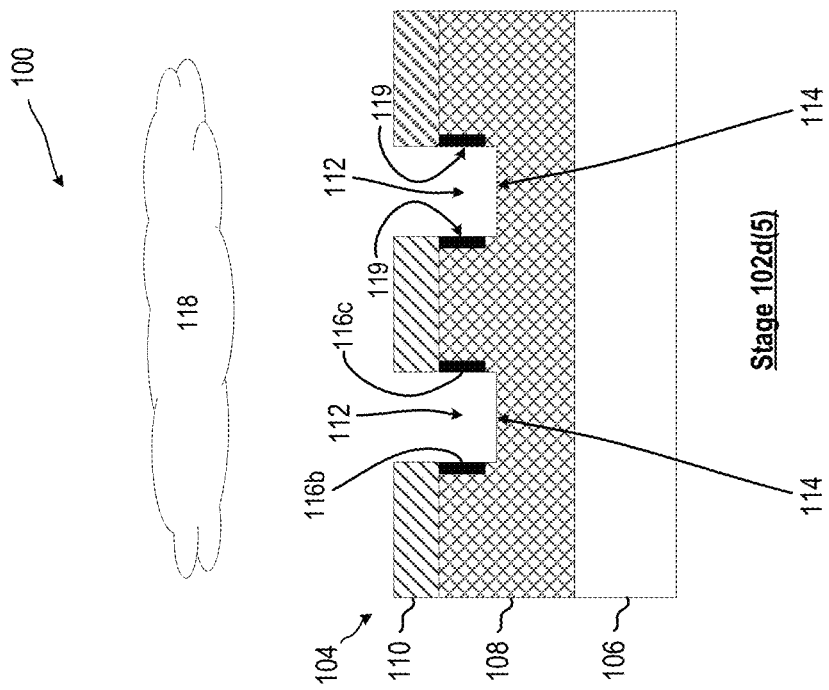
Figure 2E:
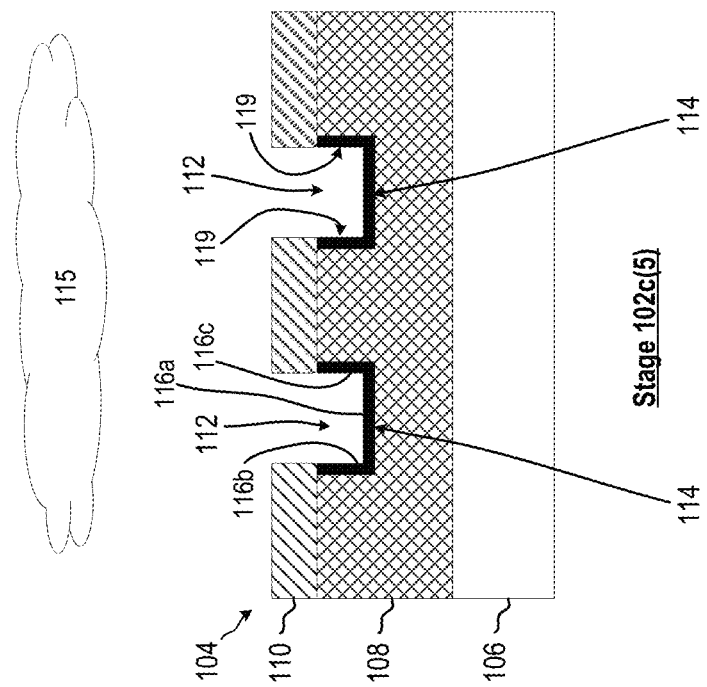

As shown in FIG. 2E, at stage 102c(5), top surfaces 114 of copper-containing layer 108 and surfaces of sidewalls 119 of copper-containing layer 108 are exposed to chlorine treatment 115, causing passivation layer 116a to form on exposed top surfaces 114 of copper-containing layer 108 and causing passivation layers 116b and 116c to form on portions of surfaces of sidewalls 119 that were exposed at stage 102d(4). At stage 102d(5), passivation layer 116a is wholly or partially removed by exposing semiconductor structure 104 to plasma 118. Because passivation layer 116a consumes some portion of copper-containing layer 108, removing passivation layer 116a formed at top surfaces 114 of copper-containing layer 108 (at the bottom of recesses 112) removes a portion of copper-containing layer 108, extending recesses 112 into copper-containing layer 108 and also exposing more of sidewalls 119. In certain embodiments, due to the directional nature of applying plasma 118, directed at top surfaces 114 of copper-containing layer 108 at the bottoms of recesses 112 (and the passivation layer 116a formed thereon), some or all of passivation layers 116b and 116c may remain at surfaces of sidewalls 119.

As can be seen in the example illustrated and described with reference to FIGS. 2a-2E, process 100, and in particular cyclic etch process 113, incrementally etches a target exposed surface (e.g., top surfaces 114) of copper-containing layer 108, which, in this example, incrementally extends recesses 112 into copper-containing layer 108. A portion of copper-containing layer 108 that is consumed by passivation layer 116a is removed using a directional anisotropic etch process that selective to passivation layer 116, providing a controlled etch process.

Figure 3A:
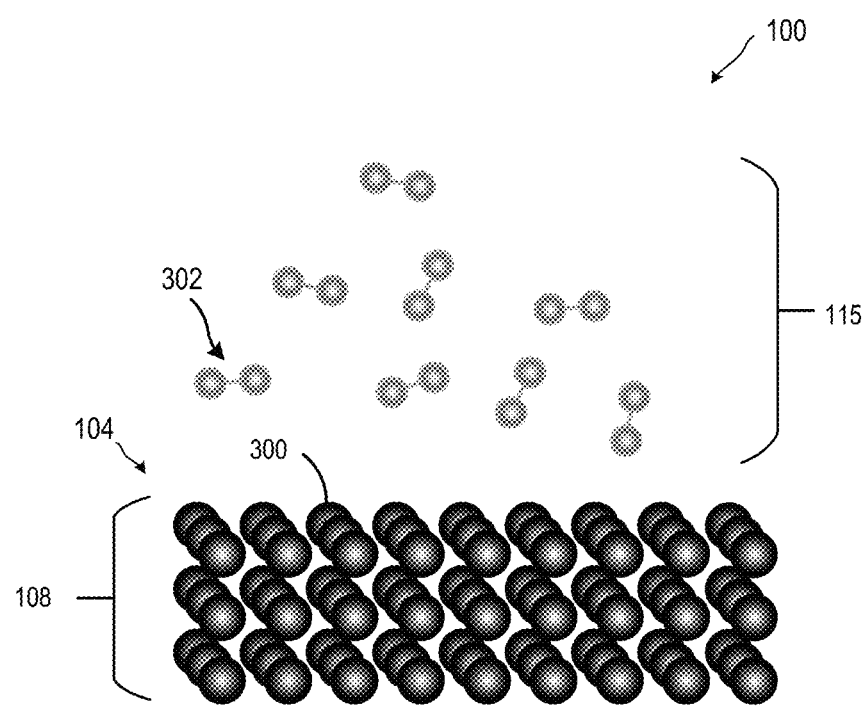
FIGS. 3A-3C illustrate example details of a semiconductor structure during a cyclic etch process of a process for etching metal during processing of the semiconductor structure, according to certain embodiments of this disclosure.
Figure 3B:
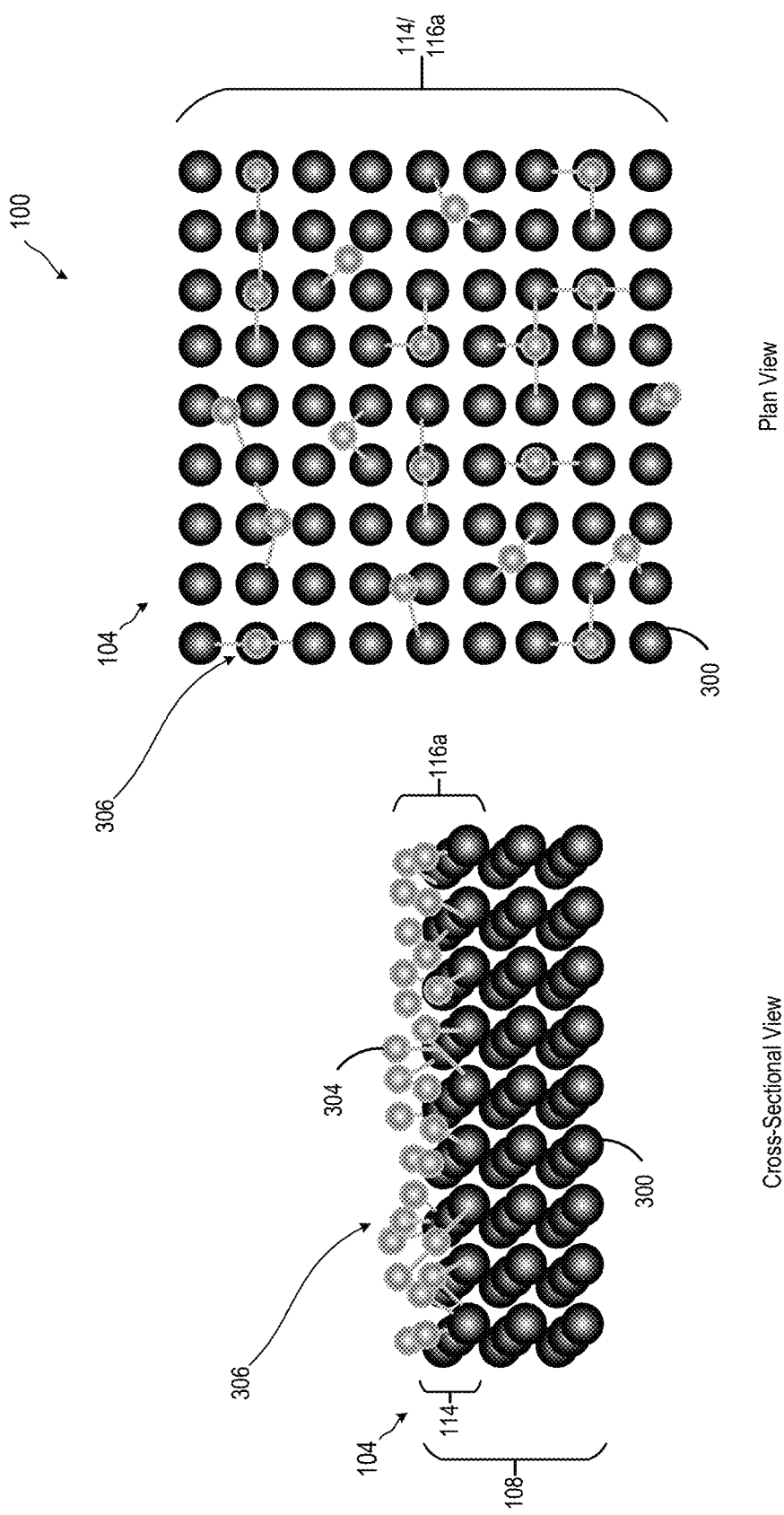
Figure 3C:
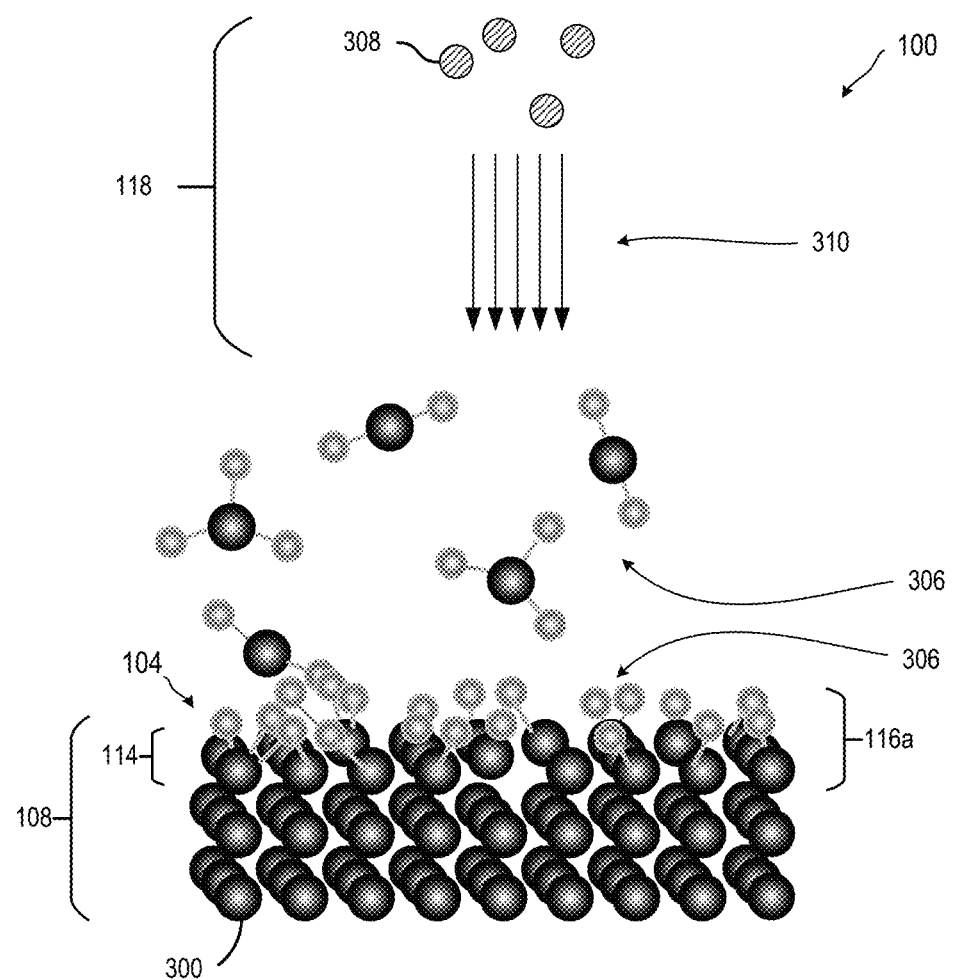

FIGS. 3A-3C illustrate example details of a semiconductor structure 104 during cyclic etch process 113 of process 100 for etching metal during processing of the semiconductor structure, according to certain embodiments of this disclosure. In particular, FIG. 3A generally corresponds to stage 102C of FIG. 1B as exposure of semiconductor structure 104 to chlorine treatment 115 begins, FIG. 3B (which illustrates both cross-sectional and plan views of semiconductor structure 104) generally corresponds to stage 102C when passivation layer 116a has formed, and FIG. 3C generally corresponds to stage 102d during exposure of semiconductor structure 104 to plasma 118.

As shown in FIG. 3A, copper-containing layer 108 includes copper particles 300 and chlorine treatment 115 includes chlorine gas particles 302. For purposes of this description particles can be atoms, molecules, ions, or any other suitable subdivision of the respective layers of which the particles are a part. In certain embodiments, copper particles 300 are copper atoms and chlorine gas particles 302 are a compound of two chlorine atoms ($Cl_2$), which is a neutral chlorine gas.

As shown in FIG. 3B, at least some chlorine gas particles 302 of chlorine treatment 115 have disassociated from one another (as chlorine particles 304, such as chlorine atoms) and combined with copper particles 300 at a surface of copper-containing layer 108 to form passivation layer 116a of $Cu_yCl_x$ structures 306 (e.g., $Cu_yCl_x$ compounds). Exposure of copper particles 300 of copper-containing layer 108 to chlorine gas (e.g., chlorine gas particles 302) is self-limiting, and a chlorine molecule of chlorine gas (e.g., of $Cl_2$) disassociates in a facile manner, bonding to copper atoms (e.g., copper particles 300) after disassociation to thereby form $Cu_yCl_x$ structures 306 (e.g., $Cu_yCl_x$ compounds).

Although this disclosure contemplates formation of $Cu_yCl_x$ structures 306 over any suitable percentage of a surface of copper-containing layer 108, in certain embodiments, in stage 102C (e.g., exposure of semiconductor structure 104 to chlorine treatment ns) results in about thirty percent to about seventy percent of the exposed surface of copper-containing layer 108 being converted to $Cu_yCl_x$. In certain embodiments, stage 102C (e.g., exposure of semiconductor structure 104 to chlorine treatment 115) results in approximately fifty-percent coverage. For example, in certain embodiments, a limit on chlorine absorption might by steric hindrance associated with neighboring chlorine particles 304 that have attached to copper particles 300 at the surface of copper-containing layer 108. A rougher surface of copper-containing layer 108 may have greater surface area, potentially allowing for more attachment of chlorine particles 304 to copper particles 30o at the surface of copper-containing layer 108.

For example, in certain embodiments, the process a chlorine molecule of chlorine gas (e.g., of $Cl_2$) disassociating and bonding to copper atoms (e.g., copper particles 300) after disassociation may stop after a certain coverage value (e.g., about 50%) on a crystalline copper surface. In certain embodiments, with less than 100% coverage of passivation layer 116, neighboring, non-chlorine-passivated copper atoms of an exposed surface of copper-containing layer 108 may shift position to attempt to bind to another chlorine atom. This may open pathways to copper atoms at subsurface levels of copper-containing layer 108. However, due to the energy for subsurface absorption of chlorine atoms being relatively large (e.g., >about 3V), it may be possible to avoid or at least limit such subsurface absorption and thereby limit morphology changes to an exposed surface of copper-containing layer 108.

As shown in FIG. 3C, passivation layer 116 (e.g., passivation layer 116a) of copper-containing layer 108 is exposed to plasma 118, which etches passivation layer 116a. Plasma 118 includes argon particles 308, and exposing passivation layer 116a of copper-containing layer 108 to plasma 118 includes directing argon particles 308 in direction 310 toward passivation layer 116a of copper-containing layer 108, which may anisotropically etch passivation layer 116a, removing copper particles 300 to which chlorine particles 304 of chlorine treatment 115 bonded ($Cu_yCl_x$ structures 306, as shown in FIG. 3B). For example, argon particles 308 may bombard copper-containing layer 108 (including passivation layer 116a) with a sufficient energy to cause $Cu_yCl_x$ structures 306 (e.g., $Cu_yCl_x$ compounds) to detach from the surface of copper-contain layer 108 and, in certain embodiments, with low enough energy to minimize ion sputtering.

In certain embodiments, a relatively low amount of energy can liberate $Cu_yCl_x$ structures 306. This capability, coupled with the self-limiting nature of the formation of passivation layer 116a (e.g., see FIG. 3B) provides for approximately a layer-by-layer removal of a target one or more surfaces (e.g., top surfaces 114) of copper-containing layer 108. In certain embodiments, while cyclic etch process 113 can be performed at any suitable pressure due to the low ion energies for removing passivation layer 116, cyclic etch process 113 can by executed at low pressure (e.g., ≤about 10 mTorr) due to the rapid saturation of copper by chlorine mediated by $Cl_2$ gas (e.g., at stage 102C during formation of passivation layer 116). Such low pressure, in certain embodiments, may reduce or eliminate the risk of by-product redeposition during the etch process of stage 102d.

Variations of copper chloride etch by-products may be generated during the etch step (e.g., stage 102d). For example, CuCl, $CuCl_2$, and $CuCl_3$ all may be stable etch by-products having ΔE values of approximately −1.33 eV, +0.28 eV, and +2.19 eV, respectively. In certain embodiments, $CuCl_3$ is generally only available through collaborative interactions with physisorbed $Cl_2$ molecules, which may limit the occurrence of $CuCl_3$. In certain embodiments, plasma concentration and power are selected to break the approximately 0.86 eV copper surface bond of copper-containing layer 108.

Figure 4:
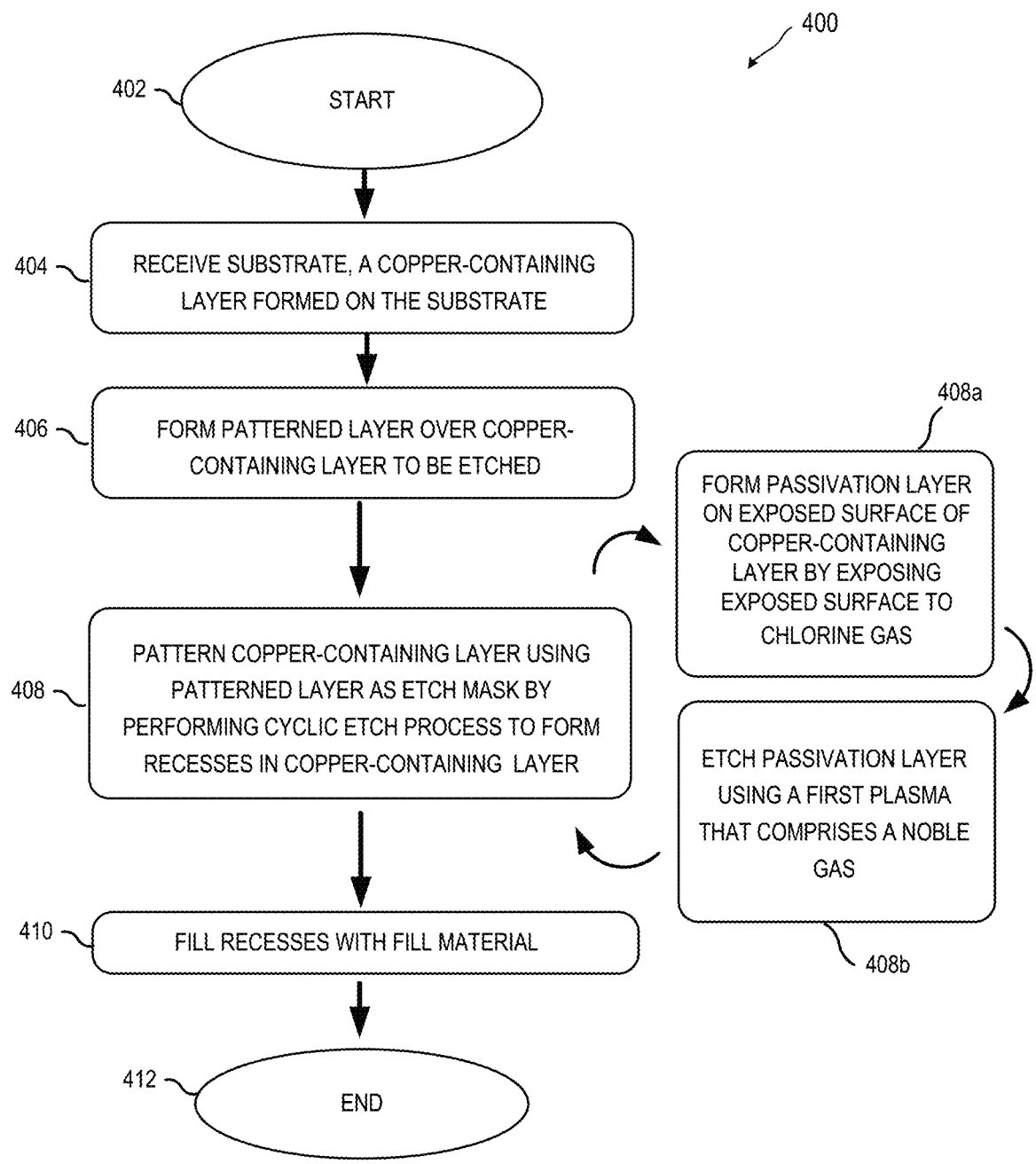
FIG. 4 illustrates an example method for processing a semiconductor structure, according to certain embodiments of this disclosure.

FIG. 4 illustrates an example method 400 for processing a semiconductor structure 104, according to certain embodiments of this disclosure. The method begins at step 402. At step 404, a substrate 106 is received. Substrate 106 includes a copper-containing layer 108 formed thereon. In certain embodiments, copper-containing layer 108 is pure copper. At step 406, patterned layer no is formed over copper-containing layer 108, copper-containing layer 108 being formed over substrate 106. For example, patterned layer no may be patterned using a patterned resist layer as an etch mask. In certain embodiments, forming patterned layer 110 includes defining a pattern in patterned layer no, and that pattern defines an etch pattern for forming features (e.g., recesses 112 and structures 123) in copper-containing layer 108 using cyclic etch process 113. For example, the pattern defined by patterned layer no may define recesses 112 for etching corresponding recesses 112 in copper-containing layer 108 such that remaining portions of copper-containing layer 108 following cyclic etch process 113 define conductive features of a semiconductor device, such as conductive contacts, conductive lines, conductive vias, and/or the like.

At step 408, copper-containing layer 108 is patterned using patterned layer no as an etch mask by performing cyclic etch process 113. In certain embodiments, cyclic etch process 113 includes forming, at step 408a in a first etch step (e.g., a chlorine exposure step), a passivation layer 116 on one or more exposed surfaces of copper-containing layer 108 by exposing the one or more exposed surfaces of copper-containing layer 108 to a chlorine treatment 115 that includes chlorine gas. In certain embodiments, passivation layer 116 includes $Cu_yCl_x$. Passivation layer 116 replaces at least a portion of a surface layer of copper-containing layer 108. In certain embodiments, passivation layer 116 forms in a self-limiting process and penetrates copper-containing layer 108 at one or more exposed surfaces by a depth of three copper atoms or less.

In certain embodiments, forming, in step 408a, passivation layer 116 on one or more exposed surfaces of copper-containing layer 108 by exposing the one or more exposed surfaces of copper-containing layer 108 to chlorine treatment 115 includes performing a thermal deposition process to cause the $Cl_2$ to disassociate and react with the one or more exposed surfaces of copper-containing layer 108 to form passivation layer 116 (e.g., $Cu_yCl_x$ structures 306). In certain embodiments, forming, in step 408a, passivation layer 116 on one or more exposed surfaces of copper-containing layer 108 by exposing the one or more exposed surfaces of copper-containing layer 108 to chlorine treatment 115 includes a plasma deposition process. For example, the one or more exposed surfaces of copper-containing layer 108 may be exposed to the chlorine-containing plasma with sufficient energy to cause the $Cl_2$ to disassociate and react with the one or more exposed surfaces of the copper layer to form the passivation layer 116 (e.g., the $Cu_yCl_x$ structures 306).

In certain embodiments, the one or more exposed surfaces of copper-containing layer 108 on which passivation layer 116 is formed include one or more top surfaces 114 of copper-containing layer 108, surfaces of sidewalls 119 of copper-containing layer 108, or a combination of one or more top surfaces of copper-containing layer 108 and surfaces of sidewalls 119 of copper-containing layer 108.

In certain embodiments, at an initial instance of the first etch step (e.g., the chlorine exposure step) at step 408a, the one or more exposed surfaces of copper-containing layer 108 may include the target exposed surface, which, in one example, is a top surface 114 of copper-containing layer 108 at a bottom of recess 112. In certain embodiments, at subsequent instances of the first etch step (e.g., the chlorine exposure step) at step 408a, the one or more exposed surfaces of copper-containing layer 108 may include the target exposed surface (e.g., top surface 114) and surfaces of sidewalls 119 of copper-containing layer 108 in recess 112.

In certain embodiments, cyclic etch process 113 includes etching, at step 408b in a second etch step (e.g., a plasma etch step) at least a portion of passivation layer 116 of copper-containing layer 108 using a plasma 118. In certain embodiments, plasma 118 includes a noble gas, such as argon. Each etching of passivation layer 116 removes at least a portion of copper-containing layer 108, extending recess 112 in copper-containing layer 108.

In certain embodiments, step 408b includes exposing, in a plasma etch step, substrate 106 with copper-containing layer 108 to plasma 118 (e.g., an argon plasma) that is directed to a target exposed surface (e.g., top surface 114) of copper-containing layer 108 with sufficient energy to cause at least a portion of the $Cu_yCl_x$ structures 306 at the one or more exposed surfaces of copper-containing layer 108 to be removed from copper-containing layer 108 to extend recess 112 into copper-containing layer 108. In certain embodiments, the sufficient energy is less than or equal to about 40 eV.

The cyclic nature of cyclic etch process 113 means that it can be repeated a suitable number of times to incrementally form recesses 112 in copper-containing layer 108, such that the depth of recesses 112 are increased with each iteration of cyclic etch process 113. Furthermore, the cyclic nature of cyclic etch process 113, coupled with the formation of passivation layer 116, facilitates reducing or eliminating modification of morphology of a surface of copper-containing layer 108 during etching of copper-containing layer 108. For example, cyclic etch process 113 may be performed a predetermined number of times. As another example, cyclic etch process 113 may be performed until top surface 122 of substrate 106 is exposed at the bottom of recesses 112 in copper-containing layer 108.

In certain embodiments, and in an example in which steps 408a and 408b are performed in a same process chamber, after step 408a of cyclic etch process 113 of method 400 and prior to step 408b of cyclic etch process 113, the process chamber in which steps 408a and 408b may be performed may be purged to remove remaining gases or other materials associated with step 408a.

At step 410, recesses 112 may be filled with a fill material 124. Fill material 124 may include any suitable material or combination of materials. In certain embodiments, fill material includes a dielectric material. This disclosure contemplates filling recesses with fill material 124 using any suitable type of process or combination of types of processes. In certain embodiments, method 400 includes removing the portions of passivation layer 116 that are formed at sidewalls 119 (e.g., passivation layer 116b and 116c) of copper-containing layer 108 in recess 112 prior to filling recess 112 with fill material 124.

At step 412, method 400 ends.

Figure 5:
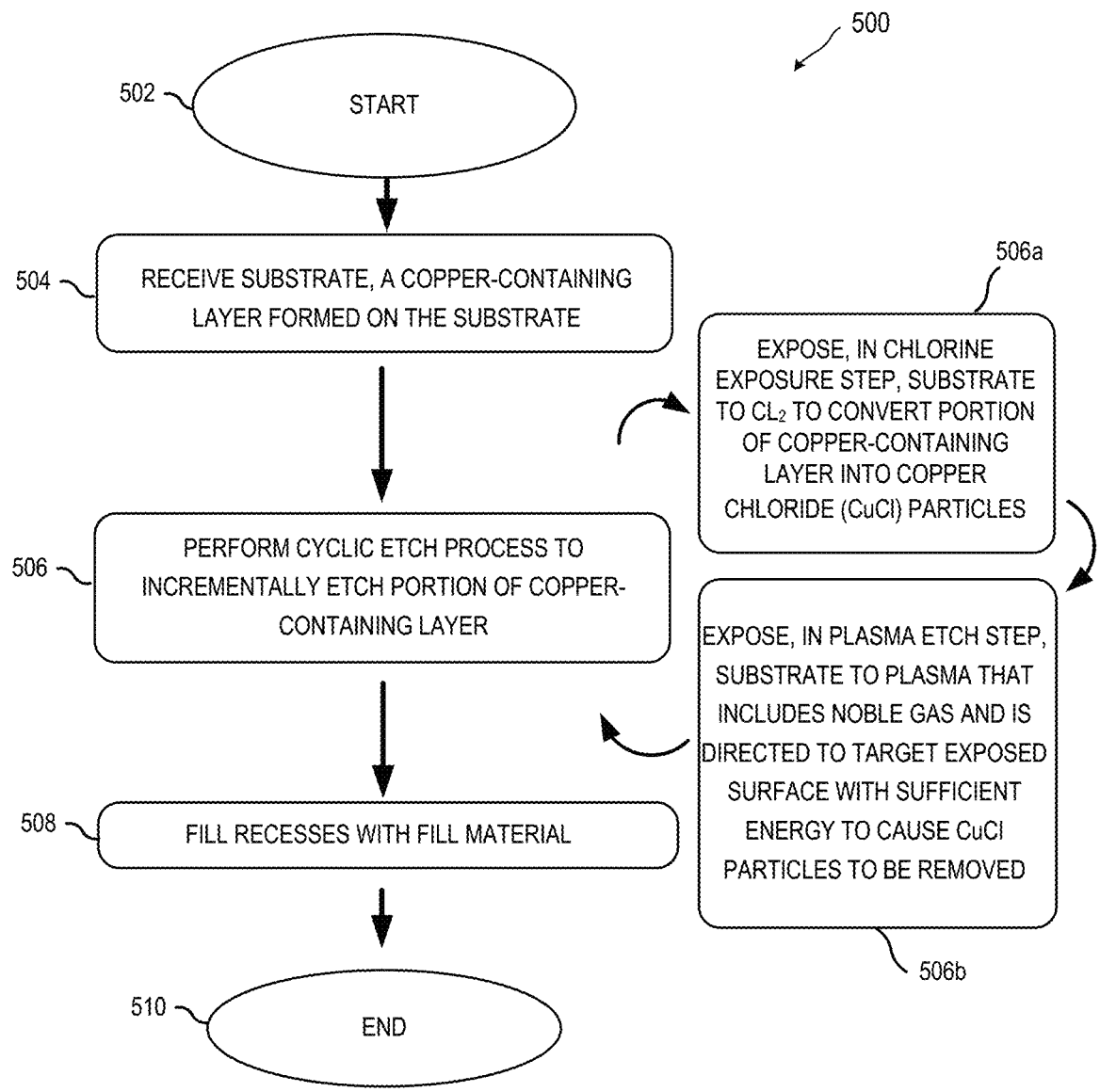
FIG. 5 illustrates an example method for processing a semiconductor structure, according to certain embodiments of this disclosure.

FIG. 5 illustrates an example method 500 for processing a semiconductor structure 104, according to certain embodiments of this disclosure. The method begins at step 502. At step 504, a substrate 106 is received. Substrate 106 includes a copper-containing layer 108 formed thereon. In certain embodiments, copper-containing layer 108 is pure copper.

At step 506, cyclic etch process 113 is performed to incrementally etch a portion of copper-containing layer 108. In certain embodiments, copper-containing layer 108 has a target exposed surface defining the portion of the copper-containing layer to be incrementally etched. For example, the target exposed surface might be a top surface 114 of copper-containing layer 108 at a bottom of recess 112.

In certain embodiments, cyclic etch process 113 includes exposing, at step 506a in a chlorine exposure step, substrate 106 with copper-containing layer 108 to chlorine gas ($Cl_2$) to convert a portion of copper-containing layer 108 to copper chloride ($Cu_yCl_x$) structures 306 at the target exposed surface of copper-containing layer 108. The copper of ($Cu_yCl_x$) structures 306 may be a surface portion of copper-containing layer 108 at the target exposed surface (and potentially at other exposed surfaces of copper-containing layer 108). In certain embodiments, the chlorine exposure step of step 506a converts less than 100% of a target exposed surface of copper-containing layer 108 to copper chloride ($Cu_yCl_x$) structures, and, as a particular example, converts about 50% of a target exposed surface of copper-containing layer 108 to copper chloride ($Cu_yCl_x$) structures.

In certain embodiments, step 506a includes, according to a thermal deposition process, injecting the $Cl_2$ into a process chamber of a processing tool and elevating a temperature of the process chamber to cause the $Cl_2$ to disassociate and react with the exposed target surface of copper-containing layer 108 to form $Cu_yCl_x$ structures 306. In certain embodiments, step 506a includes, according to a plasma deposition process, injecting the $Cl_2$ into a process chamber of a processing tool and generating a chlorine-containing plasma (e.g., plasma 118) in the process chamber from the $Cl_2$ and exposing the target exposed surface of copper-containing layer 108 to the chlorine-containing plasma (e.g., plasma 118) with sufficient energy to cause the $Cl_2$ to disassociate and react with the target exposed surface of copper-containing layer 108 to form $Cu_yCl_x$ structures 306.

In certain embodiments, cyclic etch process 113 includes exposing, at step 506b in a plasma etch step, substrate 106 to plasma 118. In certain embodiments, plasma 118 includes a noble gas, such as argon. In certain embodiments, plasma 118 is directed to the target exposed surface (e.g., top surface 114) of copper-containing layer 108 with sufficient energy to cause at least a portion of the $Cu_yCl_x$ structures at the target exposed surface of copper-containing layer 108 to be removed from copper-containing layer 108, and thereby etching a portion of copper-containing layer 108 at the target exposed surface of copper-containing layer 108. In certain embodiments, the sufficient energy is less than or equal to about 40 eV.

The cyclic nature of cyclic etch process 113 means that it can be repeated a suitable number of times to incrementally etch copper-containing layer 108 (e.g., to form recesses 112 in copper-containing layer 108). Furthermore, the cyclic nature of cyclic etch process 113, coupled with the formation of copper chloride structures 306 at the target exposed surface of copper-containing layer 108, facilitates reducing or eliminating modification of morphology of the target exposed surface of copper-containing layer 108 during etching of copper-containing layer 108. For example, cyclic etch process 113 may be performed a predetermined number of times. As another example, cyclic etch process 113 may be performed until top surface 122 of substrate 106 is exposed at the bottom of recesses 112 in copper-containing layer 108.

In certain embodiments, the chlorine exposure step (e.g., step 506a) and the plasma etch step (e.g., step 506b) are performed using different processing tools or in different process chambers of a same processing tool. In certain embodiments, and in an example in which steps 506a and 506b are performed in a same process chamber, after step 506a of cyclic etch process 113 of method 500 and prior to step 506b of cyclic etch process 113, the process chamber in which steps 506a and 506b may be performed may be purged to remove remaining gases or other materials associated with step 506a.

At step 508, recesses 112 may be filled with a fill material 124. Fill material 124 may include any suitable material or combination of materials. In certain embodiments, fill material includes a dielectric material. This disclosure contemplates filling recesses with fill material 124 using any suitable type of process or combination of types of processes.

At step 510, method 500 ends.

Figure 6:
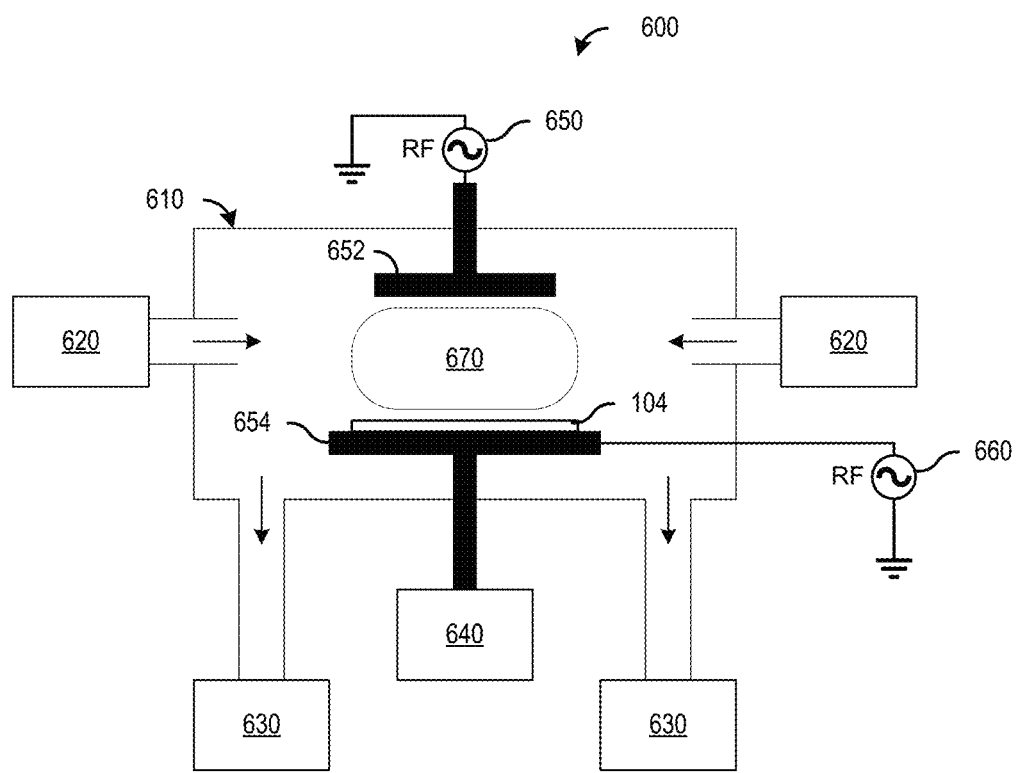
FIG. 6 illustrates a general schematic of an example plasma process system, according to certain embodiments of this disclosure.

FIG. 6 illustrates a general schematic of an example plasma process system 600, according to certain embodiments of this disclosure. Although a particular example plasma process system 600 is illustrated and described, this disclosure contemplates using any suitable type of plasma process system 600. Plasma process system 600 may be used to perform some or all of the plasma process steps.

Plasma process system 60o includes process chamber 610, gas delivery system 620, vacuum exhaust system 630, temperature controller 640, and power sources 650 and 660. Process chamber 610 includes electrode 652 and substrate holder 654.

Some or all of the steps described with respect to FIGS. 1-5 may be performed using plasma process system 600, with semiconductor structure 104 being position on substrate holder 654 of process chamber 610. For example, to the extent a plasma process is used to form passivation layer 116 or to etch copper-containing layer 108, semiconductor structure 104 may be positioned in process chamber 610 and exposed to a suitable plasma 670, which depending on the stage of processing could be chlorine treatment 115 implemented as a plasma or could be plasma 118 as examples.

Gas delivery system 620, vacuum exhaust system 630, temperature controller 640, power sources 650 and 660, and electrode 652 may be programmed or otherwise operated according to desired process conditions for a given processing step. For example, to the extent a plasma process is used to form passivation layer 116, these components of plasma process system 600 may be set according to the example process conditions and associated parameters described in connection with forming passivation layer 116. As another example, to the extent a plasma process is used to etch recesses 112 in copper-containing layer 108, these components of plasma process system 600 may be set according to the example process conditions and associated parameters described in connection with etching recesses 112 in copper-containing layer 108.

Although this disclosure describes or illustrates particular process/method steps as occurring in a particular order, this disclosure contemplates the process/method steps occurring in any suitable order. Moreover, this disclosure contemplates the process/method steps being repeated one or more times in any suitable order. Although this disclosure describes or illustrates particular process/method steps as occurring in sequence, this disclosure contemplates the process/method steps occurring at substantially the same time, where appropriate.

While this disclosure has been described with reference to illustrative embodiments, this description is not intended to be construed in a limiting sense. Various modifications and combinations of the illustrative embodiments, as well as other embodiments of the disclosure, will be apparent to persons skilled in the art upon reference to the description. It is therefore intended that the appended claims encompass any such modifications or embodiments.

What is claimed is:

1. A method of processing a semiconductor structure, the method comprising:
   forming a patterned layer over a copper layer to be etched, the copper layer being disposed over a substrate; and
   patterning the copper layer, using the patterned layer as an etch mask, by performing a cyclic etch process to form a recess in the copper layer, the cyclic etch process comprising:
   forming, in a first etch step, a passivation layer on an exposed surface of the copper layer by exposing the exposed surface of the copper layer to a chlorine gas, the passivation layer replacing at least a portion of a surface layer of the copper layer; and
   subsequently etching, in a second etch step, the passivation layer using a first plasma, the first plasma comprising a noble gas, each cycle of the cyclic etch process extending the recess in the copper layer.

2. The method of claim 1, wherein forming, in the first etch step, the passivation layer on the exposed surface of the copper layer by exposing the exposed surface of the copper layer to chlorine gas comprises a thermal deposition process.

3. The method of claim 1, wherein forming, in the first etch step, the passivation layer on the exposed surface of the copper layer by exposing the exposed surface of the copper layer to chlorine gas comprises a plasma deposition process.

4. The method of claim 1, wherein the exposed surface of the copper layer on which the passivation layer is formed comprises a top surface of the copper layer, sidewall surfaces of the copper layer, or a combination of the top surface of the copper layer and the sidewall surfaces of the copper layer.

5. The method of claim 1, wherein the passivation layer comprises copper chloride (CuCl) structures.

6. The method of claim 5, wherein about thirty percent to about seventy percent of the exposed surface of the copper layer is converted to the CuCl structures.

7. The method of claim 1, wherein the noble gas is argon.

8. The method of claim 1, further comprising, subsequent to completing the cyclic etch process, filling the recess with a fill material that comprises a dielectric material.

9. The method of claim 1, wherein, during one or more instances of the first etch step, the passivation layer is formed along sidewall surfaces of the copper layer in the recess exposed by the second etch step.

10. The method of claim 1, wherein, during the second etch step, the first plasma is directed at a portion of the passivation layer that is formed at a top surface of the copper layer located at a bottom of the recess.

11. A method of processing a semiconductor structure, the method comprising:
    receiving a substrate, a copper-containing layer being formed on the substrate; and
    performing a cyclic etch process to incrementally etch a portion of the copper-containing layer, the copper-containing layer having a target exposed surface defining the portion of the copper-containing layer to be etched, the cyclic etch process comprising:
    exposing, in a chlorine exposure step, the substrate with the copper-containing layer to a chlorine gas (Cl$_2$) to convert a portion of the copper-containing layer into copper chloride (CuCl) structures; and
    subsequently exposing, in a plasma etch step, the substrate with the copper-containing layer to a first plasma, the first plasma comprising a noble gas and being directed to the target exposed surface of the copper-containing layer with sufficient energy to cause at least a portion of the CuCl structures to be removed from the copper-containing layer.

12. The method of claim 11, wherein the chlorine exposure step and the plasma etch step are performed using different processing tools or in different process chambers of a same processing tool.

13. The method of claim 11, wherein:
    the chlorine exposure step and the plasma etch step are performed in a same process chamber of a same processing tool; and
    the method further comprises, during each cycle of the cyclic etch process, performing a purge of the same process chamber between the chlorine exposure step and the plasma etch step.

14. The method of claim 11, comprising repeating the cyclic etch process a sufficient number of times to etch the portion of the copper-containing layer.

15. The method of claim 11, wherein exposing the substrate with the copper-containing layer to the $Cl_2$ comprises:
according to a thermal deposition process, injecting the $Cl_2$ into a process chamber of a processing tool and elevating a temperature of the process chamber of the processing tool to cause the $Cl_2$ to disassociate and react with the exposed target surface of the copper-containing layer to form the CuCl structures; or
according to a plasma deposition process, injecting the $Cl_2$ into a process chamber of a processing tool and generating a chlorine-containing plasma in the process chamber of the processing tool from the $Cl_2$ and exposing the target exposed surface of the copper-containing layer to the chlorine-containing plasma with sufficient energy to cause the $Cl_2$ to disassociate and react with the target exposed surface of the copper-containing layer to form the CuCl structures.

16. A method of processing a semiconductor structure, the method comprising:
forming a patterned layer over a copper layer to be etched, the copper layer being disposed over a substrate; and
patterning the copper layer, using the patterned layer as an etch mask, by performing a cyclic etch process to incrementally form a recess in the copper layer, the cyclic etch process comprising:
exposing, in a chlorine exposure step, the substrate with the copper layer to a chlorine gas ($Cl_2$), causing CuCl structures to form at one or more exposed surfaces of the copper layer; and
subsequently exposing, in a plasma etch step, the substrate with the copper layer to an argon-containing plasma that is directed to a target exposed surface of the copper layer with sufficient energy to cause at least a portion of the CuCl structures at the one or more exposed surfaces of the copper layer to be removed from the copper layer to extend the recess into the copper layer;
wherein:
at an initial instance of the chlorine exposure step, the one or more exposed surfaces of the copper layer comprise the target exposed surface, the target exposed surface being a top surface of the copper layer at a bottom of the recess; and
at subsequent instances of the chlorine exposure step, the one or more exposed surfaces of the copper layer comprise the target exposed surface and sidewall surfaces of the copper layer in the recess.

17. The method of claim 16, wherein the chlorine exposure step comprises performing a thermal deposition process to cause the $Cl_2$ to disassociate and react with the one or more exposed surfaces of the copper layer to form the CuCl structures.

18. The method of claim 16, wherein the chlorine exposure step comprises generating a chlorine-containing plasma from the $Cl_2$ and exposing the one or more exposed surfaces of the copper layer to the chlorine-containing plasma with sufficient energy to cause the $Cl_2$ to disassociate and react with the one or more exposed surfaces of the copper layer to form the CuCl structures.

19. The method of claim 16, wherein the sufficient energy is less than or equal to about 40 eV.

20. The method of claim 16, further comprising, subsequent to completing the cyclic etch process, filling the recess with a fill material that comprises a dielectric material, the method comprising removing the CuCl structures at the sidewall surfaces of the copper layer in the recess prior to filling the recess with the fill material.

* * * * *